US012106940B2

(12) United States Patent
Nishiyama et al.

(10) Patent No.: US 12,106,940 B2
(45) Date of Patent: Oct. 1, 2024

(54) SYSTEMS AND METHODS FOR STORAGE AND SUPPLY OF F3NO-FREE FNO GASES AND F3NO-FREE FNO GAS MIXTURES FOR SEMICONDUCTOR PROCESSES

(71) Applicant: L'Air Liquide, Société Anonyme pour l'Etude et l'Exploitation des Procédés Georges Claude, Paris (FR)

(72) Inventors: Ayaka Nishiyama, Tsukuba (JP); Jiro Yokota, Tsukuba (JP); Chih-yu Hsu, Tsukuba (JP); Peng Shen, Tsukuba (JP); Nathan Stafford, Bear, DE (US)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 0 days.

(21) Appl. No.: 17/575,049

(22) Filed: Jan. 13, 2022

(65) Prior Publication Data

US 2022/0208517 A1    Jun. 30, 2022

Related U.S. Application Data

(62) Division of application No. 16/227,623, filed on Dec. 20, 2018, now abandoned.

(51) Int. Cl.
*H01J 37/32*    (2006.01)
*C01B 21/084*    (2006.01)
(Continued)

(52) U.S. Cl.
CPC ...... *H01J 37/3244* (2013.01); *C01B 21/0844* (2013.01); *C09K 13/00* (2013.01);
(Continued)

(58) Field of Classification Search
CPC ............ H01J 37/3244; H01J 37/32467; H01J 2237/334; H01J 2237/006;
(Continued)

(56) References Cited

U.S. PATENT DOCUMENTS

| 2,504,867 A | 6/1948 | Muller |
| 3,043,662 A | 7/1962 | Lipscomb |

(Continued)

FOREIGN PATENT DOCUMENTS

| JP | 2013 179126 | 9/2013 |
| JP | 2014 179553 | 9/2014 |

(Continued)

OTHER PUBLICATIONS

Holloway, J.H. et al., Preparations and reactions of inorganic main-group oxide fluoride, Advances in Inorganic Chemistry and Radiochemistry, vol. 27, 157-164.
(Continued)

*Primary Examiner* — Jeffrie R Lund
(74) *Attorney, Agent, or Firm* — Yan Jiang

(57) ABSTRACT

A method for storage and supply of a F3NO-free FNO-containing gas comprises the steps of storing the F3NO-free FNO-containing gas in a NiP coated steel cylinder with a polished inner surface, releasing the F3NO-free FNO-containing gas from the cylinder to a manifold assembly by activating a cylinder valve in fluid communication with the cylinder and the manifold assembly, de-pressurizing the F3NO-free FNO-containing gas by activating a pressure regulator in the manifold assembly so as to divide the manifold assembly into a first pressure zone upstream of the pressure regulator and a second pressure zone downstream of the pressure regulator, and feeding the de-pressurized F3NO-free FNO-containing gas to a target reactor downstream of the second pressure zone.

4 Claims, 13 Drawing Sheets

(51) Int. Cl.
*C09K 13/00* (2006.01)
*H01L 21/311* (2006.01)
*H01L 21/67* (2006.01)

(52) U.S. Cl.
CPC .. *H01J 37/32467* (2013.01); *H01L 21/31116* (2013.01); *H01L 21/67069* (2013.01); *C01P 2002/82* (2013.01); *C01P 2006/80* (2013.01); *H01J 2237/006* (2013.01); *H01J 2237/334* (2013.01)

(58) Field of Classification Search
CPC ......... H01L 21/67069; H01L 21/31116; C09K 13/00; C01B 21/0844; C01P 2006/80; C01P 2002/82; C23C 16/45561
See application file for complete search history.

(56) References Cited

U.S. PATENT DOCUMENTS

| | | | |
|---|---|---|---|
| 3,074,781 | A | 1/1963 | Anello et al. |
| 3,226,448 | A | 12/1965 | Gordon et al. |
| 3,306,834 | A | 2/1967 | Fox et al. |
| 3,341,292 | A | 9/1967 | Maxwell et al. |
| 3,392,099 | A | 7/1968 | Fox et al. |
| 3,554,699 | A | 1/1971 | Gross |
| 4,536,252 | A | 8/1985 | McDonald et al. |
| 4,869,301 | A | 9/1989 | Ohmi et al. |
| 4,996,035 | A | 2/1991 | Stepaniuk et al. |
| 5,040,046 | A | 8/1991 | Chhabra et al. |
| 5,149,378 | A | 9/1992 | Ohmi et al. |
| 5,149,566 | A | 9/1992 | Morton et al. |
| 5,199,609 | A | 4/1993 | Ash, Jr. |
| 5,203,843 | A | 4/1993 | Hoy et al. |
| 5,500,102 | A | 3/1996 | Ichikawa et al. |
| 5,545,868 | A | 8/1996 | Ohmi et al. |
| 5,563,092 | A | 10/1996 | Ohmi |
| 5,702,673 | A | 12/1997 | Kaji et al. |
| 5,723,034 | A | 3/1998 | Ohmi |
| 5,814,238 | A | 9/1998 | Ashby et al. |
| 6,220,500 | B1 | 4/2001 | Ohmi et al. |
| 6,318,384 | B1 | 11/2001 | Khan et al. |
| 6,474,077 | B1 | 11/2002 | Botelho et al. |
| 11,098,402 | B2 | 8/2021 | Reinicker et al. |
| 2001/0002581 | A1 | 6/2001 | Nishikawa et al. |
| 2003/0143846 | A1 | 7/2003 | Sekiya et al. |
| 2003/0163008 | A1 | 8/2003 | Ohno et al. |
| 2004/0221809 | A1 | 11/2004 | Ohmi et al. |
| 2005/0026431 | A1 | 2/2005 | Kazumi et al. |
| 2005/0067045 | A1 | 3/2005 | McClure |
| 2008/0121548 | A1 | 5/2008 | Yousefiani |
| 2008/0129970 | A1 | 6/2008 | Furukawa et al. |
| 2008/0236483 | A1* | 10/2008 | Sonobe ............... C23C 16/4405 134/30 |
| 2009/0018244 | A1 | 1/2009 | Polastri et al. |
| 2010/0132744 | A1* | 6/2010 | Tadaki ................ C23C 16/4405 134/166 R |
| 2010/0264117 | A1 | 10/2010 | Ohmi et al. |
| 2013/0032600 | A1 | 2/2013 | Umezaki et al. |
| 2013/0112292 | A1 | 5/2013 | Udischas et al. |
| 2013/0220377 | A1 | 8/2013 | Sato et al. |
| 2013/0221024 | A1 | 8/2013 | Yao et al. |
| 2014/0179090 | A1 | 6/2014 | Sinha et al. |
| 2014/0248783 | A1 | 9/2014 | Kameda et al. |
| 2014/0357085 | A1 | 12/2014 | Moriya et al. |
| 2015/0251133 | A1 | 9/2015 | Cox et al. |
| 2016/0172164 | A1 | 6/2016 | Sweeney et al. |
| 2017/0067181 | A1 | 3/2017 | Wada |
| 2018/0226234 | A1 | 8/2018 | Dickinson |
| 2019/0131140 | A1* | 5/2019 | Sun ........................ C09K 13/00 |
| 2019/0206694 | A1 | 7/2019 | Takashi |
| 2019/0206696 | A1 | 7/2019 | Hsu et al. |
| 2020/0203127 | A1* | 6/2020 | Nishiyama ......... H01L 21/67213 |
| 2022/0208517 | A1* | 6/2022 | Nishiyama ........ H01L 21/67248 |

FOREIGN PATENT DOCUMENTS

| | | |
|---|---|---|
| KR | 1483276 B1 * | 1/2015 |
| WO | WO 00 73722 | 12/2000 |
| WO | WO 2008 117258 | 10/2008 |

OTHER PUBLICATIONS

Woolf, C., Oxyfluorides of nitrogen, Adv. Fluorine Chem. 5 (1965), 1-4.

Yonemura, T. et al., Evaluation of FNO and $F_3NO$ as substitute gases for semiconductor CVD chamber cleaning, Journal of the Electrochemical Society, 2003, 150(11), G707-G710.

International Search Report and Written Opinion for corresponding PCT/US2019/065915, Mar. 10, 2020.

* cited by examiner

SYSTEMS AND METHODS FOR STORAGE AND SUPPLY OF F3NO-FREE FNO GASES AND F3NO-FREE FNO GAS MIXTURES FOR SEMICONDUCTOR PROCESSES

CROSS REFERENCE TO RELATED APPLICATIONS

This application is a divisional of U.S. patent application Ser. No. 16/227,623, filed Dec. 20, 2018, the entire contents of which are incorporated herein by reference.

TECHNICAL FIELD

Disclosed are systems and methods for storing and supplying $F_3NO$-free gas and $F_3NO$-free gas mixtures, such as, $F_3NO$-free FNO, $F_3NO$-free $FNO/N_2$, $F_3NO$-free $FNO/F_2$, or $F_3NO$-free $FNO/F_2/N_2$, or the like, for semiconductor processes, and systems and methods for using the $F_3NO$-free gas and $F_3NO$-free gas mixtures to etch semiconductor structures.

BACKGROUND

Fluorine-containing compounds have been used to etch semiconductor materials. Nitrosyl fluoride (FNO) is an example of highly reactive fluorinating etching compounds that may be used as a thermal etching gas.

Various methods have been disclosed to produce FNO. For example, C. Woolf ("Oxyfluoride of Nitrogen", Adv. Fluorine Chem. 5 (1965), p 1-30) discloses using starting materials nitric oxide (NO) and fluorine ($F_2$) to produce FNO. Using NO as starting material to produce FNO, a trace of gas impurities of nitrogen oxygen compounds may exist in NO, such as nitrogen dioxide ($NO_2$), nitrous oxide ($N_2O$), etc. The reactions involved in C. Woolf include:

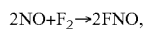

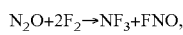

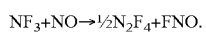

C. Woolf also discloses the reaction between nitrosyl compound and metal fluoride, such as $NOBF_4+NaF \rightarrow FNO+NaBF_4$, to produce FNO. J. H. Holloway et al. (Advances in inorganic chemistry and radiochemistry Vol. 27, p 157-195) disclose using fluorination of NOCl by AgF and fluorination of NO by $XeF_2$ or $XeF_4$ to produce FNO along with the methods shown C. Woolf. U.S. Pat. No. 4,996,035 to Stepaniuk et al. discloses mixing nitride with hydrogen fluoride at mild condition to produce FNO. U.S. Pat. No. 3,043,662 to Lipscomb et al. disclose the use of starting materials $CF_4$ or $COF_2$ and binary oxides of nitrogen, i.e., $N_2O$, NO, $N_2O_3$ and $NO_2$ at temperature larger than 1000° C. with electric arc that produces $NF_3$, $N_2F_2$ and FNO.

FNO or FNO gas mixture has been used as etching gas or cleaning agent. For example, WO 2008/117258 to Sonobe et al. discloses a method for low temperature thermal cleaning using FNO produced with $F_{2\ (excess)}+NO \rightarrow F_2+FNO$. U.S. Pat. No. 4,536,252 to McDonald et al. discloses FNO is prepared by laser-induced method used to etch semiconductor surfaces. US 2014/0248783 to Kameda et al. discloses using a mixture of $F_2$ and FNO as cleaning agent to remove a deposit in a CVD reaction chamber after forming a film on a substrate, in which FNO is produced from the reaction of $F_2$ and NO. US 2013/0220377 to Sato et al. discloses a method of cleaning a film-forming apparatus using $F_2$ and NO with heating. U.S. Pat. No. 6,318,384 to Khan et al. discloses a self-cleaning method of forming deep trenches in silicon substrates including etching films on semiconductor substrate and cleaning etch chambers with FC compounds including FNO. US 2003/0143846 to Akira et al. discloses a gas composition for cleaning the interior of film deposition chambers contaminated with silicic deposition, which comprises $F_3NO$ or combinations of $F_3NO$ with $O_2$ and/or inert gas(es) or which comprises FNO or a combination of FNO with $O_2$ and/or inert gas(es); and also a similar gas composition for etching films of silicon-containing compounds, e.g. films of semiconductive materials.

Among these prior arts, the simplest FNO preparation method is the direct reaction between $F_2$ and NO, which is expected to have high FNO yield and low impurity generation. However, using $F_2$ and NO as starting materials, depending on reaction conditions, may also produce $F_3NO$ (nitrosyl trifluoride or trifluoramine oxide), instead of FNO. For example, Maxwell et al. (U.S. Pat. No. 3,341,292) disclose a process for making $F_3NO$ from the reaction between $F_2$ and NO, in which the feed rates of $F_2$ and NO and the proportions of $F_2$ and NO are regulated so as to maintain a spontaneous exothermic reaction of $F_2$ and NO. Maxwell et al. summarized the overall reactions as $1.5F_2+NO \rightarrow F_3NO+heat$, although the mechanics of the reactions effected was not understood.

$F_3NO$ has been produced using various starting materials at various conditions. Bedsides producing $F_3NO$ from the reaction between $F_2$ and NO as disclosed by Maxwell et al. (U.S. Pat. No. 3,341,292), other starting materials are used to produce $F_3NO$. For example, Fox et al. (U.S. Pat. No. 3,306,834) disclose mixing FNO with $F_2$ at ultraviolet light irradiation in the temperature range of 25-50° C. produces $F_3NO$, i.e.,

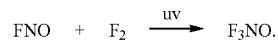

Fox et al. (U.S. Pat. No. 3,392,099) also discloses producing $F_3NO$ with starting materials $NF_3$ and $O_2$ at an electrical discharge in the reaction zone of a reactor. Gross et al. (U.S. Pat. No. 3,554,699) disclose $F_3NO$ is prepared by reaction between $NF_3$ and oxidized oxygen or $N_2O$ in the presence of a glow discharge, as follows:

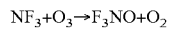

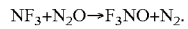

Yonemura et al. ("Evaluation of FNO and $F_3NO$ as Substitute Gases for Semiconductor CVD Chamber Cleaning", J. Electrochem. Soc. 2003 150(11): G707-G710) (2003)) disclose $F_3NO$ has higher reactivity against Si materials than FNO, as shown in FIG. 1 reproduced from Yonemura et al.

In addition, it is known that FNO is corrosive which may corrode etching gas containers and pipelines, etching chambers, substrates to be etched, etc. and lower the semiconductor device performance.

Thus, there are needs to provide a procedure to produce FNO in situ or in close proximity to where it is used to etch semiconductor surfaces with controlled amount of $F_3NO$ formation and to provide an effective material compatibility for storage and delivery of FNO as well.

SUMMARY

Disclosed are systems for storage and supply of a $F_3NO$-free FNO-containing gas. The disclosed systems include a NiP coated steel cylinder with a polished inner surface, configured and adapted to store the $F_3NO$-free FNO-containing gas, a cylinder valve, in fluid communication with the cylinder, configured and adapted to release the $F_3NO$-free FNO-containing gas from the cylinder, and a manifold assembly, comprising a pressure regulator and line components, downstream of the cylinder valve, configured and adapted to deliver the $F_3NO$-free FNO-containing gas to a target reactor, wherein the pressure regulator is configured and adapted to de-pressurize the $F_3NO$-free FNO-containing gas in the manifold assembly so as to divide the manifold assembly into a first pressure zone upstream of the pressure regulator and a second pressure zone downstream of the pressure regulator.

Disclosed are methods for storage and supply of a $F_3NO$-free FNO-containing gas. The method comprising the steps of: storing the $F_3NO$-free FNO-containing gas in a NiP coated steel cylinder with a polished inner surface, releasing the $F_3NO$-free FNO-containing gas from the cylinder to a manifold assembly by activating a cylinder valve in fluid communication with the cylinder and the manifold assembly, de-pressurizing the $F_3NO$-free FNO-containing gas by activating a pressure regulator in the manifold assembly so as to divide the manifold assembly into a first pressure zone upstream of the pressure regulator and a second pressure zone downstream of the pressure regulator, and feeding the de-pressurized $F_3NO$-free FNO-containing gas to a target reactor downstream of the second pressure zone.

Also, disclosed are etching systems. The disclosed systems include a reactor, configured and adapted to hold therein a substrate to be etched, a NiP coated steel cylinder, configured and adapted to store a pressurized etching gas $F_3NO$-free FNO, a cylinder valve, in fluid communication with the cylinder, configured and adapted to release the etching gas $F_3NO$-free FNO from the NiP coated steel cylinder, and a manifold assembly, comprising a pressure regulator and line components, downstream of the cylinder valve, configured and adapted to deliver the etching gas $F_3NO$-free FNO to the reactor, wherein the pressure regulator in the manifold assembly is configured and adapted to de-pressurize the etching gas $F_3NO$-free FNO so as to divide the manifold assembly into a first pressure zone upstream of the pressure regulator and a second pressure zone downstream of the pressure regulator.

Any of the disclosed systems and methods may include one or more of the following aspects:
- the $F_3NO$-free FNO gas containing less to no $F_3NO$ impurity;
- the $F_3NO$-free FNO gas containing less than approximately 1% $F_3NO$ by volume;
- the $F_3NO$-free FNO gas containing less than 0.1% by volume of $F_3NO$;
- the $F_3NO$-free FNO gas containing less than 0.01% by volume of $F_3NO$;
- the $F_3NO$-free referring to a gas having $F_3NO$ impurity less than 1%;
- the $F_3NO$-free FNO gas contained in the $F_3NO$-free FNO containing gas having less than approximately 1% $F_3NO$ by volume;
- a pre-synthesized FNO having a purity of 99% or higher;
- $F_2$ and NO being starting materials to produce $F_3NO$-free FNO gas in situ with the reaction of $2NO+F_2 \rightarrow 2FNO$;
- the starting material NO being pure;
- the starting material NO being between approximately 99.9% by volume and approximately 100.0% by volume;
- the starting material NO being between approximately 99.99% by volume and approximately 100.00% by volume;
- the starting material NO being between approximately 99.999% by volume and approximately 100.000% by volume;
- the starting material NO gas containing between approximately 0.0% by volume and approximately 0.1% % by volume trace gas impurities with between approximately 0 ppm by volume to approximately 600 ppm by volume of N—O containing gases other than NO gas;
- the starting material NO gas containing between approximately 0.0% by volume and approximately 0.1% % by volume trace gas impurities with between approximately 0 ppm by volume to approximately 600 ppm by volume of $NO_2$;
- the starting material NO gas containing between approximately 0.0% by volume and approximately 0.1% % by volume trace gas impurities with between approximately 0 ppm by volume to approximately 600 ppm by volume of $N_2O$;
- mixing $F_2$ and NO at a ratio $F_2/NO$ under or less than stoicmetric condition ($F_2/NO \le \frac{1}{2}$);
- the $F_3NO$-free FNO gas diluted in an inert gas, such as $N_2$, Ar, He, Ne, Kr, Xe, or mixtures thereof, to obtain a concentration of $F_3NO$-free FNO gas as needed;
- the $F_3NO$-free FNO gas diluted in $N_2$ to obtain a concentration of $F_3NO$-free FNO gas as needed;
- the concentration of $F_3NO$-free FNO gas in $N_2$ ranging from 0.01% to 80%;
- the concentration of $F_3NO$-free FNO gas in $N_2$ ranging from 0.01% to 30%;
- the concentration of $F_3NO$-free FNO gas in $N_2$ being 3%;
- the concentration of $F_3NO$-free FNO gas in $N_2$ being 15%;
- the $F_3NO$-free FNO gas mixture being a gas mixture of $F_3NO$-free $FNO/F_2/N_2$;
- the concentration of $F_3NO$-free FNO gas in $F_3NO$-free $FNO/F_2/N_2$ gas mixture ranging from 0.01% to 80%;
- the concentration of $F_3NO$-free FNO gas in $F_3NO$-free $FNO/F_2/N_2$ gas mixture ranging from 0.01% to 30%;
- the concentration of $F_3NO$-free FNO gas in $F_3NO$-free $FNO/F_2/N_2$ gas mixture being 3%;
- the concentration of $F_3NO$-free FNO gas in $F_3NO$-free $FNO/F_2/N_2$ gas mixture being 15%;
- the concentration of $F_2$ in $F_3NO$-free $FNO/F_2/N_2$ gas mixture ranging from 0% to 80%;
- the concentration of $F_2$ in $F_3NO$-free $FNO/F_2/N_2$ gas mixture ranging from 0% to 20%;
- the concentration of $F_2$ in $F_3NO$-free $FNO/F_2/N_2$ gas mixture being 0%;
- the concentration of $F_2$ in $F_3NO$-free $FNO/F_2/N_2$ gas mixture being 10%;
- the concentration of $F_3NO$-free FNO gas in the gas mixture of $FNO/F_2/N_2$ being 15% and the concentration of $F_2$ in the gas mixture of $FNO/F_2/N_2$ being 10%;
- producing the gas mixture of $FNO/F_2/N_2$ with a two-step of $F_2$ mixing process;
- the two-step of $F_2$ mixing process including i) $F_2$ and NO are mixed under or less than stoicmetric condition ($F_2/NO \le \frac{1}{2}$) to produce $F_3NO$-free FNO gas and ii) additional $F_2$ is added to the produced $F_3NO$-free FNO gas;
- the two-step of $F_2$ mixing process suppressing the formation of $F_3NO$;
- the $F_3NO$-free FNO gas and the $F_3NO$-free FNO gas mixture being stored in a NiP coated steel cylinder;

the NiP coated steel cylinder being a carbon steel cylinder made of steel;

the NiP coated steel cylinder being a carbon steel cylinder made of an alloy 4130X;

the NiP coated steel cylinder being a carbon steel cylinder made of an alloy 4130X with NiP coated inner surface;

the NiP coated inner surface of the NiP coated steel cylinder being polished;

the cylinder valve in fluid communication with the NiP coated steel cylinder being made of nickel material;

the cylinder valve in fluid communication with the NiP coated steel cylinder being made of nickel alloy;

the cylinder valve in fluid communication with the NiP coated steel cylinder being made of nickel alloy having nickel content at least 14% by weight;

the cylinder valve being a Ceodeux D306 Ni body Ni diaphragm;

the manifold assembly divided into a first pressure zone and a second pressure zone by the pressure regulator;

the pressure in the first pressure zone being larger than the pressure in the second pressure zone;

the pressure in the first pressure zone ranging from 0.8 MPa to 3.5 MPa;

the pressure in the first pressure zone being 0.99 MPa;

the pressure in the second pressure zone ranging from 0.1 MPa to 0.8 MPa;

the pressure in the second pressure zone being 0.5 MPa;

the line components in the first pressure zone being composed of high nickel content materials;

the line components in the first pressure zone being composed of MONEL®;

the line components in the first pressure zone being composed of INCONEL®;

the line components in the first pressure zone being composed of HASTELLOY® C-22® alloy;

the high nickel content material containing at least 14% nickel by weight;

the line components in the first pressure zone not being composed of Fe-containing alloy;

the line components in the first pressure zone not being composed of stainless steel (SS);

the line components in the first pressure zone not being composed of Mn-steel;

the line components in the second pressure zone being composed of low nickel content material that contains less than 14% nickel by weight;

the line components in the second pressure zone being composed of low nickel content material that contains no nickel;

the line components in the second pressure zone being composed of any metal or mental alloy;

the line components in the second pressure zone is made of a metal or a meal alloy;

the line components in the second pressure zone being composed of stainless steel;

the stainless steel being SS316L;

the SS316L containing up to 14% nickel;

the SS316L being compatible with $F_3NO$-only;

the SS316L being not compatible with $F_3NO$-free FNO/$F_2$/$N_2$;

the SS316L being compatible with $F_3NO$-free FNO/$F_2$/$N_2$ in the second pressure zone after passivation using $F_2$ or FNO;

the SS316L being suitable for making the line components in the second pressure zone if the etching gas does not contains $F_2$;

the $F_3NO$-free FNO gas-containing gas being selected from the group consisting of $F_3NO$-free FNO gas, a mixture of the $F_3NO$-free FNO gas with an inert gas, a mixture of the $F_3NO$-free FNO gas with an additional gas and a mixture of the $F_3NO$-free FNO gas with the inert gas and the additional gas;

the $F_3NO$-free FNO gas-containing gas being $F_3NO$-free FNO gas;

the $F_3NO$-free FNO gas-containing gas being a mixture of the $F_3NO$-free FNO gas with an inert gas;

the $F_3NO$-free FNO gas-containing gas being a mixture of the $F_3NO$-free FNO gas with an additional gas;

the $F_3NO$-free FNO gas-containing gas being a mixture of the $F_3NO$-free FNO gas with the inert gas and the additional gas;

the $F_3NO$-free FNO gas mixture being selected from the group consisting of $F_3NO$-free FNO gas, a mixture of the $F_3NO$-free FNO gas with an inert gas, a mixture of the $F_3NO$-free FNO gas with an additional gas and a mixture of the $F_3NO$-free FNO gas with the inert gas and the additional gas;

the $F_3NO$-free FNO gas mixture being $F_3NO$-free FNO gas;

the $F_3NO$-free FNO gas mixture being a mixture of the $F_3NO$-free FNO gas with an inert gas;

the $F_3NO$-free FNO gas mixture being a mixture of the $F_3NO$-free FNO gas with an additional gas;

the $F_3NO$-free FNO gas mixture being a mixture of the $F_3NO$-free FNO gas with the inert gas and the additional gas;

the inert gas being $N_2$, Ar, He, Ne, Kr, Xe, or mixtures thereof;

the inert gas being $N_2$;

the additional gas being selected from the group consisting of $F_2$, HF, $cC_4F_8$, $C_4F_8$, $C_4F_6$, $C_5F_8$, $CF_4$, $CH_3F$, $CF_3H$, $CH_2F_2$, COS, $CS_2$, $CF_3I$, $C_2F_3I$, $C_2F_5I$, CFN, $SO_2$, NO, $O_2$, $CO_2$, CO, $NO_2$, $N_2O$, $O_3$, $Cl_2$, $H_2$, HBr, and combination thereof;

the additional gas being $F_2$;

oxidizer being added to the $F_3NO$-free FNO gas or the $F_3NO$-free FNO gas-containing gas mixture;

the oxidizer being $O_2$, $O_3$, CO, $CO_2$, COS, NO, $N_2O$, $NO_2$, $SO_2$, and combinations thereof;

the oxidizer and the $F_3NO$-free FNO gas or the $F_3NO$-free FNO gas-containing gas mixture being mixed together prior to introduction into the reaction chamber or the etching chamber;

The oxidizer comprising between approximately 0.01% by volume to approximately 99.99% by volume of the mixture introduced into the chamber (with 99.99% by volume representing introduction of almost pure oxidizer for the continuous introduction alternative);

the oxidizer being introduced continuously into the reaction chamber and the etching gas being introduced into the reaction chamber in pulses;

producing $F_3NO$-free FNO gas contained in the $F_3NO$-free FNO gas-containing gas by mixing NO and $F_2$ gases at a ratio of $F_2$ gas to NO gas less than or equal to ½ and a purity of NO gas at least 99.9% by volume, wherein the produced $F_3NO$-free FNO gas contains less than approximately 1% $F_3NO$;

producing a gas mixture of $F_3NO$-free FNO gas, $F_2$ and $N_2$ by a two-step $F_2$ mixing procedure comprising the steps of mixing $F_2$ and NO at a ratio of $F_2$/NO less than or equal to ½ and a purity of NO at least 99.9% by volume to produce the $F_3NO$-free FNO gas;

mixing the produced $F_3NO$-free FNO gas with an additional amount of $F_2$ to produce the gas mixture of the $F_3NO$-free FNO gas and $F_2$; and diluting the gas mixture of the $F_3NO$-free FNO gas and $F_2$ in $N_2$ to form the gas mixture of $F_3NO$-free FNO gas, $F_2$ and $N_2$;

passivating the manifold assembly with $F_2$;

passivating the manifold assembly with FNO;

passivating the first pressure zone of the manifold assembly with $F_2$;

passivating the first pressure zone of the manifold assembly with FNO;

passivating the second pressure zone of the manifold assembly with $F_2$;

passivating the second pressure zone of the manifold assembly with FNO;

a first gas line parallel to the manifold assembly;

the first gas line feeding an additional etching gas to the etching chamber, where in the additional etching gas is selected from the group consisting of $F_2$, HF, $cC_4F_8$, $C_4F_8$, $C_4F_6$, $C_5F_8$, $CF_4$, $CH_3F$, $CF_3H$, $CH_2F_2$, COS, $CS_2$, $CF_3I$, $C_2F_3I$, $C_2F_5I$, CFN, $SO_2$, NO, $O_2$, $CO_2$, CO, $NO_2$, $N_2O$, $O_3$, $Cl_2$, $H_2$, HBr, and combination thereof;

the first gas line feeding an additional etching gas to the NiP coated steel cylinder, where in the additional etching gas is selected from the group consisting of $F_2$, HF, $cC_4F_8$, $C_4F_8$, $C_4F_6$, $C_5F_8$, $CF_4$, $CH_3F$, $CF_3H$, $CH_2F_2$, COS, $CS_2$, $CF_3I$, $C_2F_3I$, $C_2F_5I$, CFN, $SO_2$, NO, $O_2$, $CO_2$, CO, $NO_2$, $N_2O$, $O_3$, $Cl_2$, $H_2$, HBr, and combination thereof;

the first gas line feeding $F_2$;

the $F_3NO$-free FNO etching gas and the additional gas (e.g., $F_2$) being mixed prior to introduction to the reaction chamber;

a second gas line for feeding an inert gas to the first pressure zone of the manifold assembly, wherein the $F_3NO$-free FNO gas is mixed with the inert gas to produce a diluted $F_3NO$-free FNO gas, wherein the inert gas is $N_2$, Ar, He, Ne, Kr, Xe, or mixtures thereof;

a second gas line for feeding $N_2$ to the first pressure zone of the manifold assembly;

a second gas line for feeding an inert gas to NiP coated steel cylinder, wherein the $F_3NO$-free FNO gas is mixed with the inert gas to produce a diluted $F_3NO$-free FNO gas, wherein the inert gas is $N_2$, Ar, He, Ne, Kr, Xe, or mixtures thereof;

a second gas line for feeding $N_2$ to NiP coated steel cylinder;

the $F_3NO$-free FNO gas in the gas cylinder contains the inert gas;

the $F_3NO$-free FNO gas in the gas cylinder contains $N_2$;

the etching process being thermal etching process;

the etching process being plasma dry etching process;

the etching chamber being heated to a temperature;

a temperature of the etching chamber ranging from 20° C. to 1000° C.;

a temperature of the etching chamber ranging from room temperature to 1000° C.;

a temperature of the etching chamber ranging from 100° C. to 600° C.;

a temperature of the etching chamber ranging from 100° C. to 300° C.;

a temperature of the etching chamber being 100° C.;

a temperature of the etching chamber being 500° C.;

a temperature of the etching chamber being 600° C.;

a pressure in the first pressure zone ranging from 0.8 MPa to 3.5 MPa;

a pressure in the second pressure zone ranging from 0.1 MPa to 0.8 MPa;

a pressure in the first pressure zone being 0.99 MPa;

a pressure in the second pressure zone being 0.5 MPa;

a pressure in the etching chamber ranges from approximately 0.1 mTorr and approximately 1000 Torr;

a flow rate of $F_3NO$-free FNO containing etching gas ranging from approximately 0.1 sccm to approximately 30 slm;

The reaction chamber being a thermal etching chamber;

The reaction chamber being a plasma etching chamber;

The reaction chamber being a deposition chamber;

the substrate in the reactor containing a film to be etched;

the substrate in the etching chamber containing a film to be etched;

an inner surface of the reactor containing deposits to be etched;

the inner surface of the reactor containing a film to be etched;

an inner surface of the deposition chamber containing a layer of deposits on the inner surface to be etched or removed;

the inner surface of the deposition chamber containing a film on the inner surface to be etched or removed;

an inner surface of the deposition chamber containing a layer of deposits on the inner surface to be cleaned;

the inner surface of the deposition chamber containing a film on the inner surface to be cleaned;

the line components in the first pressure zone including gas filters, pressure sensors, pressure regulator, gas valves, pipes, and combinations thereof;

the line components in the second pressure zone including gas filters, pressure sensors, gas valves, mass flow controllers (MFCs), pipes, and combinations thereof;

the high nickel content material being a nickel alloy having at least 14% nickel by weight;

the high nickel content material being pure nickel;

the high nickel content material being nickel alloys;

the high nickel content material being MONEL®, INCONEL® or HASTELLOY® C-22® alloy;

the low nickel content material being a nickel alloy having less than 14% nickel by weight; and the low nickel content material being stainless steel;

Also, disclosed is a gaseous composition for semiconductor applications. The gaseous composition comprises $F_3NO$-free FNO gas containing less than approximately 1% $F_3NO$ impurity by volume; and an inert gas being capable of suppressing the concentration of $F_3NO$ impurity in the $F_3NO$-free FNO gas. The disclosed gas composition include one or more of the following aspects:

the $F_3NO$-free FNO gas containing less than approximately 1% $F_3NO$ impurity by volume;

the inert gas being $N_2$, Ar, He, Ne, Kr, Xe, or mixtures thereof;

the inert gas being $N_2$;

the inert gas being capable of suppressing the concentration of $F_3NO$ impurity in the $F_3NO$-free FNO gas;

$N_2$ being capable of suppressing the concentration of $F_3NO$ impurity in the $F_3NO$-free FNO gas;

the $F_3NO$-free FNO gas having a purity of 99% by volume;

the $F_3NO$-free FNO gas having a purity ranging from approximately 99% to approximately 99.999% by volume;

the $F_3NO$-free FNO gas containing less than 1% by volume trace gas impurities;

the trace gas impurities comprising water;

the trace gas impurities comprising $NO_2$;
the trace gas impurities comprising $N_2O$;
the trace gas impurities comprising $F_3NO$;
the $F_3NO$-free FNO gas containing less than 1% by volume of $F_3NO$; and
the $F_3NO$-free FNO gas having a water content of less than 20 ppmw.

NOTATION AND NOMENCLATURE

The following detailed description and claims utilize a number of abbreviations, symbols, and terms, which are generally well known in the art, and include:

As used herein, the indefinite article "a" or "an" means one or more.

As used herein, "about" or "around" or "approximately" in the text or in a claim means±10% of the value stated.

As used herein, "less to no" in the text or a claim means the value stated having a range from approximately 1% to nil.

As used herein, "room temperature" in the text or in a claim means from approximately 20° C. to approximately 25° C.

The term "ambient temperature" refers to an environment temperature approximately 20° C. to approximately 25° C.

The term "$F_3NO$-free" or "$F_3NO$-less" refers to a gas mixture contains less than 1% $F_3NO$ impurity.

The trademark "HASTELLOY®" refers to a family of nickel-based steel alloys exhibiting high resistance to corrosion. HASTELLOY® is a nickel-molybdenum alloy. There are a hundred different Hastelloy® alloys marked B, C, D, M, NS, W, X . . . 22 letters sometimes numbered by a few numbers. There are many different grades of Hastelloy®, many of which are nickel-chromium-molybdenum alloys. Each of these grades has been optimized for a specific purpose, but all of them are highly resistant to corrosion. HASTELLOY® has outstanding resistance to highly oxidizing and reducing agents, making it a great choice for moderate to severe corrosive environments. The most versatile of the HASTELLOY® alloy are the "C-type" alloys, such as, HASTELLOY® C-22® alloy.

The trademark "HASTELLOY® C-22® alloy" refers to one of the well-known and well-proven nickel-chromium-molybdenum materials, the chief attributes of which are resistance to both oxidizing and non-oxidizing chemicals, and protection from pitting, crevice attack, and stress corrosion cracking. The composition of nickel in HASTELLOY® C-22® alloy is 56% by weight.

The trademark "MONEL®" refers to a group of nickel alloys, primarily composed of nickel and copper, with small amounts of iron, manganese, carbon, and silicon. Stronger than pure nickel, MONEL® alloys are resistant to corrosion by many agents, including rapidly flowing seawater. The composition of nickel in MONEL® is 63-65% or even up to 67% by weight.

The trademark "INCONEL®" refers to a family of nickel-iron-chromium superalloys. There are also many different grades of INCOLOY® available. INCONEL® alloys are oxidation-corrosion-resistant materials well suited for service in extreme environments subjected to pressure and heat. INCONEL® retains strength over a wide temperature range, attractive for high temperature applications. INCONEL® is a material that is specifically optimized for some of the toughest use conditions to be found in manufacturing. INCONEL®'s high temperature strength and resistance to seawater, brine, sour gas, and chloride make it ideal for use in the oil and gas industries. The composition of nickel in INCONEL® is 50~80% nickel by weight.

The term "high nickel content material" refers to nickel alloys that contains at least 14% nickel by weight.

The term "low nickel content material" refers to a material contains less than 14% nickel by weight or contains no nickel.

The term "stainless steel 316 (SS316)" or "steel use stainless 316 (SUS316)" (SUS, an acronym from Japanese Industrial Standards (JIS)) refers to a marine grade stainless steel, called type 316, is resistant to certain types of interactions. There are a variety of different types of 316 stainless steels, including 316 L, F, N, H, and several others. Each has different Ni content. The "L" designation means SS316L has less carbon than SS316. The SS316L contains up to 14% Ni.

The term "Ceodeux D306" refers to a high-pressure cylinder valve, which is a tied diaphragm seal type and used for ultra high purity gases (e.g., purity≥99.999%) with main body material made of Nickel and HASTELLOY®.

The term "alloy 4130X" refers to an alloy in a 41xx steel family of SAE steel grades, as specified by the Society of Automotive Engineers (SAE). Alloying elements include chromium and molybdenum, and as a result, these materials are often informally referred to as chromyl steel.

The term of "metal" refers to a solid material that is typically hard, shiny, malleable, fusible, and ductile, with good electrical and thermal conductivity. A metal may be a chemical element such as iron, gold, silver, copper, and aluminum, or an alloy such as stainless steel.

The term of "metal alloy" refers to a metal made by a combination of metals or of a metal and another element. An alloy may be a solid solution of metal elements or a mixture of metallic phases.

The term "etching system" refers to a system that removing (i.e., etching or cleaning) a film happens inside a reaction chamber. The reaction chamber may be a thermal or a plasma etching chamber or a deposition chamber. The film may be on a substrate with a substrate holder placed inside of the etching chamber, which refers to an etching process. The film may be a layer of deposits on the inner surface of the deposition chamber that needs to be removed. Removing the layer of deposits on the inner surface of the deposition chamber also refers to a cleaning process.

The term "NiP coated steel cylinder" refers to a steel cylinder with an internal surface coating of nickel plating (NiP) in which an internal surface of the NiP is polished. The steel cylinder may be a carbon steel cylinder made of alloy 4130X.

The term "polish" or "polished" refers to making a surface smooth and glossy by mechanical or electro-mechanical polishing.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (e.g., crystalline, amorphous, porous, etc.), silicon containing layers (e.g., $SiO_2$, SiN, SiON, SiCOH, etc.), metal containing layers (e.g., copper, cobalt, ruthenium, tungsten, platinum, palladium, nickel, gold, etc.) or combinations thereof. Furthermore, the substrate may be planar or patterned. The substrate may be an organic patterned photoresist film. The substrate may include layers of oxides which are used as dielectric materials in MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TiN, NbN) that are used as electrodes. One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates.

The term "wafer" or "patterned wafer" refers to a wafer having a stack of silicon-containing films on a substrate and a patterned hardmask layer on the stack of silicon-containing films formed for pattern etch.

The term "pattern etch" or "patterned etch" refers to etching a non-planar structure, such as a stack of silicon-containing films below a patterned hardmask layer.

As used herein, the term "etch" or "etching" refers to an isotropic etching process and/or an anisotropic etching process. The isotropic etch process involves a chemical reaction between the etching compound and the substrate resulting in part of material on the substrate being removed. The etching processes may be multiple processes and the etching processes may involve in a surface reaction to modify the surface in the first step and in the second step a removal of the modified surface layer. This type of etching process includes chemical dry etching, vapor phase chemical etching, thermal dry etching, or the like. The isotropic etch process produces a lateral or horizontal etch profile in a substrate. The isotropic etch process produces recesses or horizontal recesses on a sidewall of a pre-formed aperture in a substrate. The anisotropic etch process involves a plasma etching process (i.e., a dry etch process) in which ion bombardment accelerates the chemical reaction in the vertical direction so that vertical sidewalls are formed along the edges of the masked features at right angles to the substrate (Manos and Flamm, Thermal etching an Introduction, Academic Press, Inc. 1989 pp. 12-13). The plasma etching process produces a vertical etch profile in a substrate. The plasma etching process produces vertical apertures, trenches, channel holes, gate trenches, staircase contacts, capacitor holes, contact holes, etc., in the substrate.

The term "selectivity" means the ratio of the etch rate of one material to the etch rate of another material. The term "selective etch" or "selectively etch" means to etch one material more than another material, or in other words to have a greater or less than 1:1 etch selectivity between two materials.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

Note that herein, the terms "etching compound" and "etching gas" may be used interchangeably when the etching compound is in a gaseous state at room temperature and ambient pressure. It is understood that an etching compound may correspond to, or related to an etching gas, and that the etching gas may refer to the etching compound.

As used herein, the abbreviation "NAND" refers to a "Negated AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

The standard abbreviations of the elements from the periodic table of elements are used herein. It should be understood that elements might be referred to by these abbreviation (e.g., Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

Please note that the silicon-containing films, such as SiN and SiO, are listed throughout the specification and claims without reference to their proper stoichiometry. The silicon-containing films may include pure silicon (Si) layers, such as crystalline Si, poly-silicon (p-Si or polycrystalline Si), or amorphous silicon; silicon nitride ($Si_kN_l$) layers; or silicon oxide ($Si_nO_m$) layers; or mixtures thereof, wherein k, l, m, and n, inclusively range from 0.1 to 6. Preferably, silicon nitride is $Si_kN_l$, where k and l each range from 0.5 to 1.5. More preferably silicon nitride is $Si_3N_4$. Herein, SiN in the following description may be used to represent SiN containing layers. Preferably silicon oxide is $Si_nO_m$, where n ranges from 0.5 to 1.5 and m ranges from 1.5 to 3.5. More preferably, silicon oxide is $SiO_2$. Herein, SiO in the following description may be used to represent $Si_nO_m$ containing layers. The silicon-containing film could also be a silicon oxide based dielectric material such as organic based or silicon oxide based low-k dielectric materials such as the Black Diamond II or III material by Applied Materials, Inc. with a formula of SiOCH. Silicon-containing film may also include $Si_aO_bN_c$ where a, b, c range from 0.1 to 6. The silicon-containing films may also include dopants, such as B, C, P, As and/or Ge.

Ranges may be expressed herein as from about one particular value, and/or to about another particular value. When such a range is expressed, it is to be understood that another embodiment is from the one particular value and/or to the other particular value, along with all combinations within said range.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1:
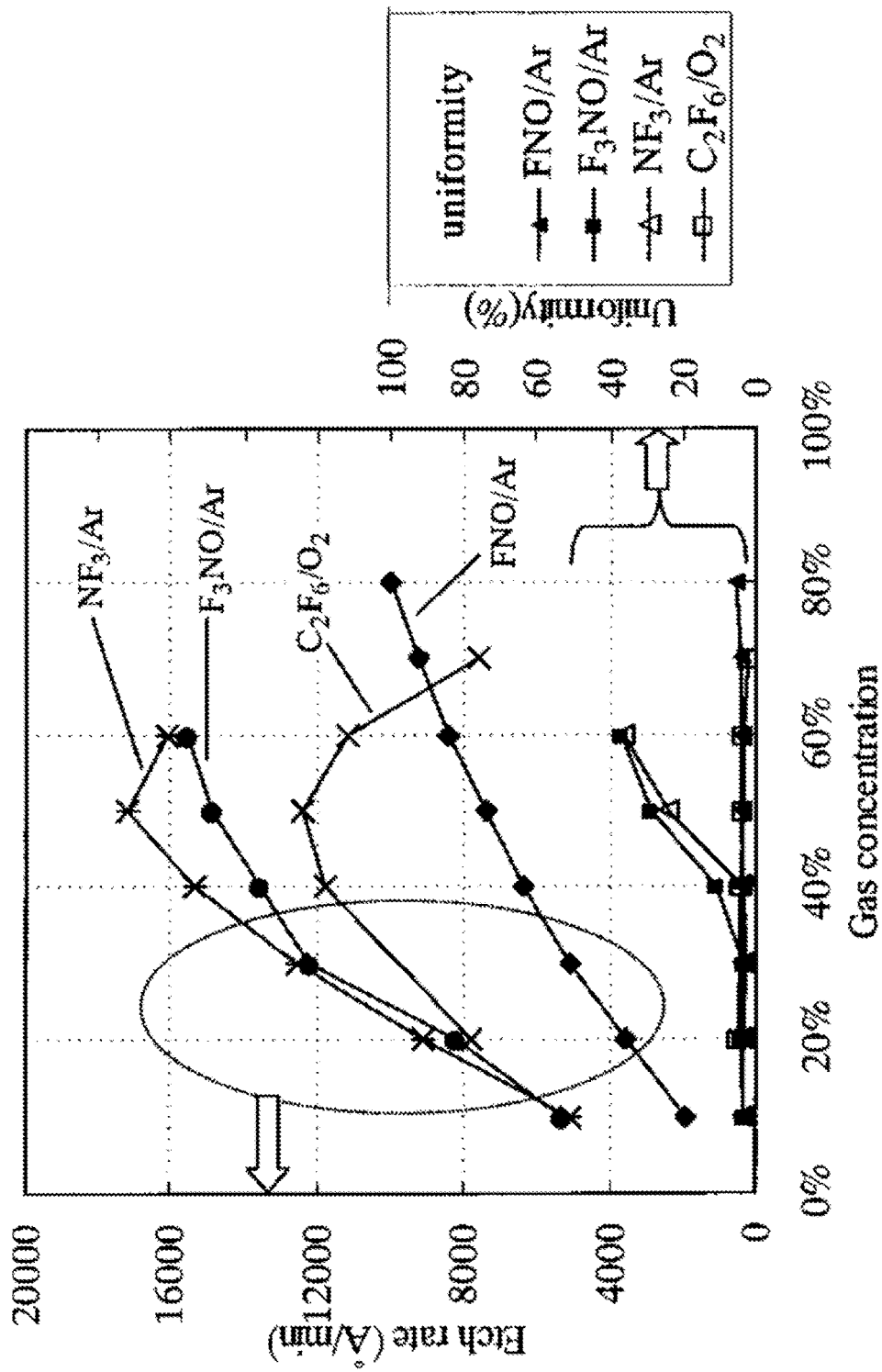
FIG. 1, reproduced from Yonemura et al., represents the etch rates as a function of gas concentration for FNO/Ar, $F_3NO/Ar$, $NF_3/Ar$ and $C_2F_6/O_2$.

Disclosed are systems and methods for storing and supplying F₃NO-free FNO gas and F₃NO-free FNO gas mixtures, such as FNO/F₂, FNO/F₂/N₂, for using as thermal and/or plasma dry etching gases to etch semiconductor structures. Disclosed are also systems and methods for thermally and/or plasma dry etching semiconductor structures using F₃NO-free FNO gas and F₃NO-free FNO gas mixtures. Furthermore, disclosed are methods for producing F₃NO-free FNO gas and F₃NO-free FNO gas mixtures for using as thermal etching gases to etch semiconductor structures. The disclosed methods for producing F₃NO-free FNO gas and F₃NO-free FNO gas mixtures may provide a purity of F₃NO-free FNO gas of 99% or greater, and an impurity of F₃NO less than 1%.

FNO (nitrosyl fluoride. CAS number: 7789-25-5, boiling point: −72.4° C. (−98.3 F)) and/or a mixture of FNO with other etching gases, such as F₂, HF, cC₄F₈, C₄F₆, CF₄, CHF₃, CF₃H, CH₂F₂, COS, CS₂, CF₃I, C₂F₃I, C₂F₅I, SO₂, and the like, may be used as highly reactive fluorinating thermal etching gases. Applicant discovered that FNO gas used for thermally etching the semiconductor structures should contain less to no F₃NO (trifluoroamine oxide, CAS number: 13847-65-9, boiling point: −87.6° C.) impurity. Thus, the disclosed F₃NO-free FNO gas contains less to no F₃NO impurity, which refers to F₃NO-free FNO gas. F₃NO-free herein refers to a gas having F₃NO impurity less than 1%. F₃NO-free may also refer to F₃NO-less having the same definition as F₃NO-free. In semiconductor applications, FNO may be diluted in an inert gas, such as N₂, Ar, He, Ne, Kr, Xe, or mixtures thereof, to obtain a concentration of FNO as needed. The FNO gas mixture FNO/F₂/N₂ is one of exemplary FNO gas mixtures. When F₃NO-free FNO diluted in the inert gas, the F₃NO impurity in the mixture is even less than 1%. For instance, 15% FNO in a gas mixture of F₃NO-free FNO and N₂ may have F₃NO impurity less than 0.15%.

In semiconductor applications, FNO gas may be pre-synthesized for use as an etchant or produced in situ or in close proximity to where it is used to etch semiconductor structures. Regarding the pre-synthesized FNO gas, a purity of 99%⁺ FNO may be obtained and F₃NO impurity exists in FNO is less than 1% taking into account that other impurities may exist in FNO gas.

It is known that mixing F₂ and NO in situ produces FNO. However, using F₂ and NO as starting materials to produce FNO may generate other products such as, F₃NO, FNO₂, NF₃, N₂O, NO₂, etc., as byproducts existing in the product FNO. The reactions involved in mixing NO and F₂ may include the following reactions.

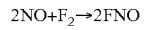

2NO+F₂→2FNO

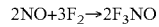

2NO+3F₂→2F₃NO

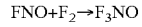

FNO+F₂→F₃NO

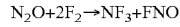

N₂O+2F₂→NF₃+FNO

N₂O and NO₂ may exist in the starting material NO as impurity.

Thus, when F₂ is mixed with NO forming a gas mixture of F₂ and NO in situ at the time it is used in an etching process, besides forming the desired FNO etching gas, oxyfluorides of nitrogen containing a grouping F—N—O, such as F₃NO, may also be formed as impurity in the gas mixture of F₂ and NO. Applicant found that F₃NO does exist in the mixture of F₂ and NO when producing FNO by mixing F₂ and NO if a ratio of F₂ to NO is very well controlled.

To our knowledge, so far no existing work has been mentioning the presence of F₃NO as impurity in either pre-synthesized FNO gas and/or in the FNO product produced in situ, such as produced by mixing F₂ and NO gas in situ. Since F₃NO has higher reactivity against Si-containing materials than FNO as shown in FIG. 1, for etching semiconductor structures, the produced etching gas FNO should be free of F₃NO. F₃NO existing in FNO etching compositions may have detrimental effects to etching processes such as, particles formed on the substrate and cracks occurring in the substrate, which may be seen in the examples that follow. F₃NO existing in FNO etching compositions may also influence etching performance, such as selectivity and etch rate controllability. Thus, a control of F₃NO formation in producing FNO is required in order to perform a precise etching process in semiconductor industry. To this point, FNO used as an etching compound has to be in high purity, with minimal F₃NO levels.

In semiconductor applications, oxyfluorides of nitrogen, i.e. compounds containing the grouping F—N—O, such as FNO, FNO₂ and F₃NO, may be corrosive to etching gas containers and pipelines, etching chambers, substrates to be etched, etc., which may lower the semiconductor device performance. In addition, materials made of containers, pipelines and components along the pipelines for storage and delivery of FNO-containing gas to an etching chamber and materials made of the etching chamber have to be compatible with FNO. This means no corrosions and no reactions occur between FNO and the above materials that could cause contaminations to the etching gases and the substrate to be etched. When FNO is produced from the precursors/starting materials (e.g., NO and F₂) at the time it is used as an etching gas, the precursors may also create different storage and handling problems from the product FNO. As a result, when producing FNO, material compatibilities between starting materials (e.g., $F_2$ and NO) and even FNO itself and a container (e.g., cylinder), valves, manifolds and a reaction chamber along with etching performance degradation thereof with short-term or long-term use have been concerned.

Material compatibility tests are important to determine if any component of the disclosed $F_3NO$-free FNO and $F_3NO$-free FNO gas mixtures will react with materials of the container (e.g., cylinder), valves, manifolds and chamber and if any component of the disclosed $F_3NO$-free FNO and $F_3NO$-free FNO gas mixtures will degrade the etching performance thereof with short term or long-term use. Material compatibility refers to a material's resistance to corrosion, rust or stains when it comes in contact with a chemical, such as $F_2$, NO, FNO, $F_3NO$, etc. At times the materials made of the container (e.g., cylinder), valves, manifolds and chamber are exposed to these chemicals at high temperatures, for example, higher than 20° C., and high pressures, for example, higher than 1 atm, for thermal etching, which may enhance their degradation.

The disclosed methods for producing $F_3NO$-free FNO gas include mixing the starting materials $F_2$ and NO by controlling mixing ratios of $F_2$ and NO. In order to obtain various concentrations of $F_3NO$-free FNO gas, an inert gas, such as $N_2$, Ar, Kr and Xe, preferably $N_2$, may be added to dilute the produced $F_3NO$-free FNO gas to a target concentration of $F_3NO$-free FNO gas. In addition, adding an inert gas helps reduce $F_3NO$ formation in the process of producing $F_3NO$-free FNO gas in situ referring to the Examples that follow. With the disclosed mixing methods, the formation of $F_3NO$ during the reaction between $F_2$ and NO may be restrained. To our knowledge, the disclosed mixing methods (i.e., mixing ratio) have not been found in the prior art for producing FNO with $F_2$ and NO. It is known a direct reaction between $F_2$ and NO is disclosed as the simplest method to produce FNO. However, there is no past work mentioning $F_3NO$ as impurity in FNO, while Applicant discovered the presence of $F_3NO$ from the reaction between $F_2$ and NO is detrimental to the use of FNO gas in various etching processes. Applicant also discovered the mixing methods of $F_2$ and NO with or without $N_2$ in order to control $F_3NO$ amount in the mixture to produce $F_3NO$-free FNO gas. This is beneficial for producing FNO gas with precise $F_3NO$ impurity control.

The disclosed methods for producing $F_3NO$-free FNO gas mixtures include mixing the starting materials $F_2$ and NO by controlling mixing ratios of $F_2$ and NO and then mixing with an addition gas by controlling mixing order of $F_2$, NO and the additional gas. The additional gas may be selected from the group consisting of $F_2$, HF, $cC_4F_8$, $C_4F_8$, $C_4F_6$, $C_5F_8$, $CF_4$, $CH_3F$, $CF_3H$, $CH_2F_2$, COS, $CS_2$, $CF_3I$, $C_2F_3I$, $C_2F_5I$, CFN, $SO_2$, NO, $O_2$, $CO_2$, CO, $NO_2$, $N_2O$, $O_3$, $Cl_2$, $H_2$, HBr, and combination thereof. Preferably, the additional gas is $F_2$. In order to obtain various concentrations of $F_3NO$-free FNO gas in the $F_3NO$-free FNO gas mixture, an inert gas, such as $N_2$, Ar, Kr and Xe, preferably $N_2$, may be added to dilute the produced $F_3NO$-free FNO gas mixture to a target concentration of $F_3NO$-free FNO gas. Similarly, adding an inert gas helps reduce $F_3NO$ formation in the process of producing $F_3NO$-free FNO gas mixture in situ referring to the Examples that follow. With the disclosed mixing methods, the formation of $F_3NO$ during the reaction between $F_2$, NO and the additional gas may be restrained. To our knowledge, the disclosed mixing methods (i.e., controlling mixing ratio and controlling mixing order) have not been found in the prior art for producing FNO gas and FNO gas mixture with $F_2$ and NO. Applicant discovered the mixing methods of $F_2$, NO and additional gas with or without $N_2$ in order to control $F_3NO$ amount in the mixture to produce $F_3NO$-free FNO gas mixture. This is beneficial for producing FNO-containing gas mixture with precise $F_3NO$ impurity control.

The disclosed mixing methods provide processes to suppress the formation of $F_3NO$ impurity when $F_2$ is mixed with NO in situ. The disclosed mixing methods for producing $F_3NO$-free FNO from $F_2$ and NO include a step of mixing $F_2$ and NO at a ratio $F_2$/NO equal to or less than stoichiometric condition ($F_2$/NO≤½). In this way, the formation of $F_3NO$ impurity in the produced $F_3NO$-free FNO may be suppressed. The produced $F_3NO$-free FNO may be further diluted in an inert gas, such as $N_2$, Ar, Kr and Xe, preferably $N_2$, to form different concentrations of $F_3NO$-free FNO in $N_2$ according to application requirements.

The disclosed mixing methods for producing $F_3NO$-free FNO gas mixture (e.g., FNO/$F_2$) from $F_2$ and NO include a two-step of $F_2$ mixing process. In the first step, $F_2$ and NO are mixed equal to or less than stoichiometric condition ($F_2$/NO≤½) to produce $F_3NO$-free FNO gas. In the second step additional $F_2$ is added to the produced $F_3NO$-free FNO gas to produce $F_3NO$-free FNO and $F_2$ gas mixture. In this way, the formation of $F_3NO$ impurity in the produced $F_3NO$-free FNO and $F_2$ gas mixture may be suppressed. The produced $F_3NO$-free FNO and $F_2$ gas mixture may be further diluted in an inert gas, such as $N_2$, Ar, Kr and Xe, preferably $N_2$, to form different concentrations of $F_3NO$-free FNO and $F_2$ in $N_2$ depending on application requirements.

NO gas is not stable and may contain a trace gas impurities of nitrogen oxygen compounds, such as $NO_2$, $N_2O$, or the like, resulting from instability. Once NO mixed with $F_2$, the trace gas impurities may react with $F_2$ to eventually produce $F_3NO$ in the product of FNO, as shown in the following reaction: $F_2+NO_2 \rightarrow F_3NO$ or $F_2+N_2O \rightarrow F_3NO$. Therefore, it is highly preferable to use high purity NO designed for low impurities like $N_2O$ and $NO_2$. In order to suppress the formation of $F_3NO$, NO gas used herein to produce FNO should be pure as pure as feasible. Preferably, the purity of NO is provided at between approximately 99.9% by volume and approximately 100.0% by volume, more preferably between approximately 99.99% by volume and approximately 100.00% by volume, and even more preferably between approximately 99.999% by volume and approximately 100.000% by volume. In addition, NO gas may contain between approximately 0.0% by volume and approximately 0.1% by volume trace gas impurities with between approximately 0 ppm by volume to approximately 600 ppm by volume of N—O containing gases other than NO gas, such as $NO_2$, $N_2O$, or the like, contained in said trace gaseous impurities.

since the disclosed mixing methods are capable of suppressing the formation of $F_3NO$, the impurity $F_3NO$ in FNO may not impact the etching performance when using the disclosed $F_3NO$-free FNO gas as thermal and/or plasma dry etching gas.

The disclosed systems and methods also include systems and methods for storage and delivery of $F_3NO$-free FNO gas and/or $F_3NO$-free FNO gas mixture through using compatible materials between FNO and containers, manifolds, pipelines, etching chambers, etc.

The disclosed method for storage and delivery of $F_3NO$-free FNO and/or $F_3NO$-free FNO diluted in an inert gas, such as $N_2$, Ar, Kr and Xe, preferably $N_2$, include storing a corrosive gas $F_3NO$-free FNO or $F_3NO$-free FNO/$N_2$ mixture in a steel cylinder made of alloy 4130X with NiP coated inner surface, and delivering the corrosive gas $F_3NO$-free FNO or $F_3NO$-free FNO/$N_2$ mixture to an application reactor through a manifold assembly. An internal surface of the steel cylinder made of alloy 4130X is coated with nickel plating, and the inner surface of the nickel plating is polished so as to have smooth surface resulting in low moisture content. Hereinafter, the steel cylinder made of alloy 4130X with an inner surface coating of nickel plating with polished inner surface of the nickel plating refers to the NiP coated steel cylinder.

A cylinder valve in fluidly communication with the cylinder and the manifold assembly is made of nickel or nickel alloy. Due to a pressure difference between the cylinder and the application reactor, the manifold assembly is divided into a high-pressure zone in fluidly communication with the cylinder valve and a low-pressure zone in fluidly communication with the application chamber by a pressure regulator or a pressure reducing device. The manifold assembly is not limited to be divided into two pressure zones. The manifold assembly may be divided into multiple pressure zones each having different reduced pressures. Thus, with the multiple pressure zones, the manifold assembly is able to deliver the gas to different reaction chambers each requiring a different reduced pressure.

The pressure of the corrosive gas $F_3NO$-free FNO or $F_3NO$-free FNO/$N_2$ mixture is reduced by the pressure regulator before entering the low-pressure zone. Line components in the high-pressure zone may be composed of high nickel content material. Line components in the low-pressure zone may be composed of low nickel content material, metal or metal alloy. The line components in the high and low-pressure zones include gas filters, pressure sensors, gas valves, mass flow controllers (MFCs), pipes, etc. The high nickel content material refers to nickel alloys that contains at least 14% nickel by weight. For example, MONEL®, INCONEL® or HASTELLOY® C-22® alloy. The low nickel content material refers to a material contains less than 14% nickel by weight or contains no nickel. For example, stainless steel. In this way, $F_3NO$ impurity and degradation of the equipment may be reduced. The NiP coated steel cylinder may be, but is not limited to, in a size ranging from 0.5 L to 49 L NiP coated steel cylinder. The cylinder valve may be a Ceodeux D306 Ni body Ni diaphragm. The cylinder valve may be made of HASTELLOY® C-22® alloy, MONEL®, INCONEL®, pure nickel, or any other high nickel content materials.

The high-pressure zone of the manifold assembly may have a pressure ranging from approximately 0.8 MPa to approximately 10 MPa, more preferably, approximately 0.8 to approximately 3.5 MPa. The low-pressure zone of the manifold assembly may have a pressure ranging from approximately 0.1 MPa to approximately 0.8 MPa. The manifold assembly includes the following line components: the pressure regulator, pressure sensors, valves, gas filters, piping, etc. in the two pressure zones. The line components in the high-pressure zone may be composed of high nickel content materials, such as, MONEL®, INCONEL® or HASTELLOY® C-22® alloy. The high nickel content material may contains at least 14% nickel. Typically, any material that contains 14% or higher nickel may be used to make of the line components in the high-pressure zone, however, Fe-containing alloy, such as stainless steel (SS), may not be used. Whereas, in the low-pressure zone the line components may be composed of low nickel content material that contains less than 14% nickel by weight or contains no nickel. The line components in the low-pressure zone may also be made of any metal or any mental alloy, including high nickel content materials. The line components in the low-pressure zone may be made of stainless steel.

The following are exemplary embodiments of the disclosed storage and delivery systems for delivery of the disclosed $F_3NO$-free FNO gas and/or $F_3NO$-free FNO gas mixture into a target application reactor (e.g., an etching chamber for etching or a deposition chamber for cleaning) in which material compatibilities are considered.

Figure 2:
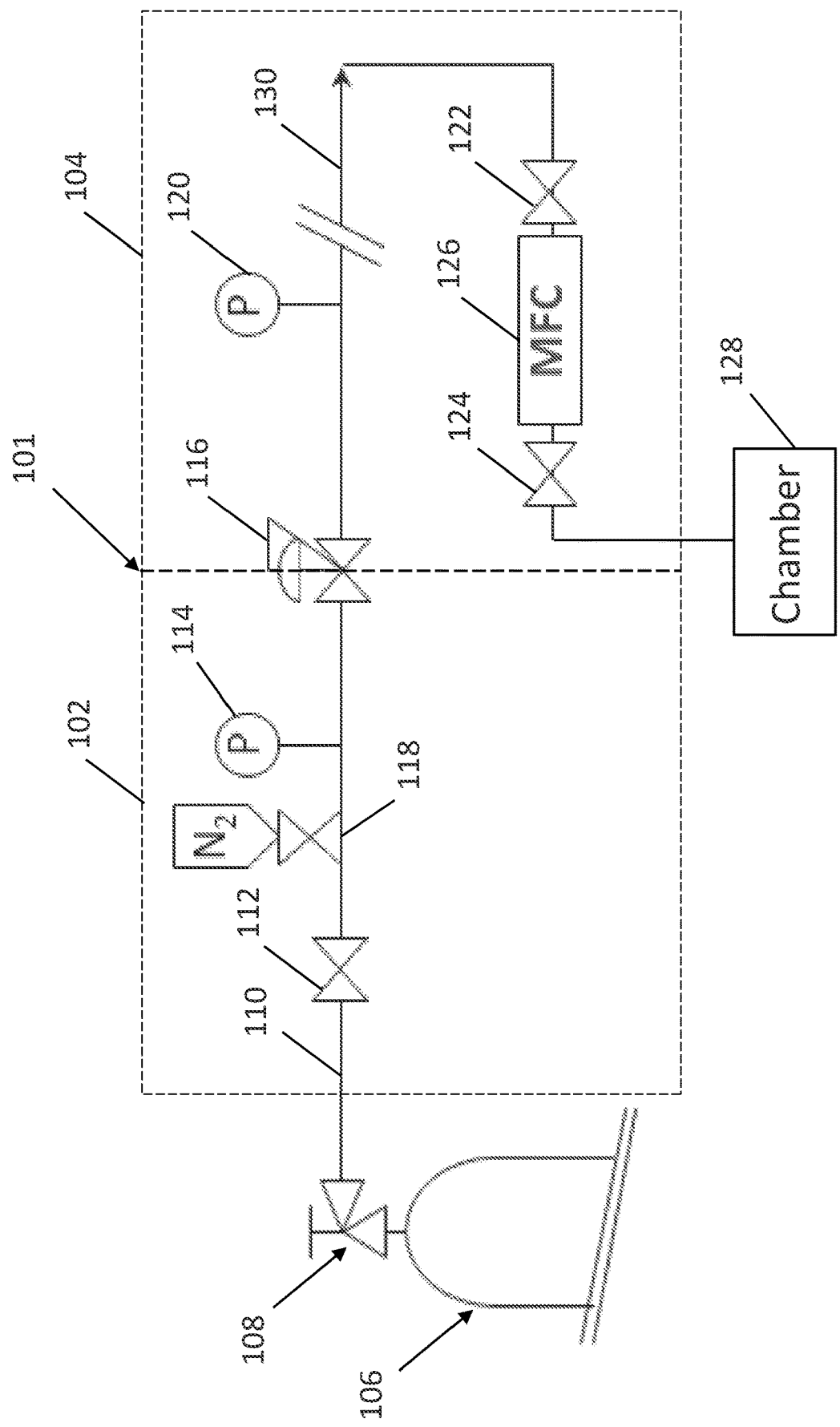
FIG. 2 is a diagram of an exemplary packaging of $F_3NO$-free FNO gas and/or $F_3NO$-free FNO gas mixture from a cylinder to a semiconductor application chamber.

In one embodiment, a packaging of $F_3NO$-free FNO gas from a cylinder to a semiconductor application, e.g., an etching chamber, is shown in FIG. 2. The packaging includes a manifold 101 that contains two pressure zones, one is a high-pressure zone 102, the other is a low-pressure zone 104. The pressure in the pressure zone 102 is higher than that in the pressure zone 104. The pressure range in the pressure zone 102 is approximately from 0.8 MPa to 10 MPa. The pressure range in the pressure zone 104 is approximately from 0.1 MPa to 0.8 MPa. In one exemplary embodiment, the pressure in the pressure zone 102 is 0.99 MPa; the pressure in the pressure zone 104 is 0.5 MPa. A cylinder 106 that contains a pressurized etching gas $F_3NO$-free FNO (e.g., from 0.8 MPa to 3.5 MPa) is fluidly connected to the pressure zone 102 through a cylinder valve 108. The $F_3NO$-free FNO gas stored in cylinder 106 may be synthesized using $F_2$ and NO as starting materials or may be a pre-synthesized FNO. The $F_3NO$-free FNO gas stored in the cylinder 106 has a purity of 99%. Alternatively, the $F_3NO$-free FNO gas stored in the cylinder 106 may be diluted in an inert gas ($N_2$, Ar, Kr and Xe), for example, diluted in $N_2$ gas, forming a mixture of $F_3NO$-free FNO and $N_2$. The cylinder 106 is a carbon steel cylinder made of alloy 4130X with an internal surface coating of nickel plating and a polished coating surface (i.e., NiP coated steel cylinder). The internal surface of coated nickel plating is important because a smooth surface may reduce contamination of moisture from air. A cylinder valve 108 controls the etching gas $F_3NO$-free FNO to be delivered from the pressure zone 102 to the pressure zone 104 through a pipeline 110, where a valve 112, a pressure sensor 114 and a pressure regulator 116 are fluidly connected to the pipeline 110. The pressure sensor 114 reads the pressure in the pressure zone 102. An inert gas (e.g., $N_2$) may be added to the $F_3NO$-free FNO gas in the pressure zone 102 to produce a diluted $F_3NO$-free FNO gas. For example, $N_2$ gas is added to the flow of $F_3NO$-free FNO gas through a valve 118 in the pressure zone 102 forming a mixture of $F_3NO$-free FNO with $N_2$ therein. If the cylinder 106 contains already diluted $F_3NO$-free FNO gas (e.g., 50% FNO in $N_2$), $N_2$ gas added to the flow of the already diluted $F_3NO$-free FNO gas through a valve 118 in the pressure zone 102 will have the already diluted $F_3NO$-free FNO gas further diluted. In this way, the concentration of $F_3NO$-free FNO gas may be adjusted depending on application requirements. The pressure regulator 116 reduces the pressure of the gas mixture of $F_3NO$-free FNO and $N_2$ before the gas mixture of $F_3NO$-free FNO with $N_2$ enters the pressure zone 104. A pressure sensor 120 reads the pressure in the pressure zone 104. The gas mixture of $F_3NO$-free FNO and $N_2$ from the pressure zone 102 is then de-pressurized and forwarded to a mass flow controller 126 in the pressure zone 104 through a pipeline 130. The mass flow controller 126 controls a flow rate of the gas mixture of $F_3NO$-free FNO and $N_2$ fed to an etching chamber 128 for an etching process. Valves 122 and 124 may be installed downstream and upstream of the mass flow controller 126.

Key materials involved in the cylinder, valves, manifolds, the chamber etc., shown in FIG. 2, include high nickel content materials including NiP coated steel, nickel, nickel alloys, and low nickel content materials including stainless steel. The $F_3NO$-free FNO gas was filled in the cylinder 106 within a pressure range between approximately 0.8 to approximately 10 MPa. The cylinder 106 may be a vessel, cylinder or any pressure container (pressure range 0.1 MPa to 10 MPa). The cylinder 106 with high nickel content valve 108 is in fluidly communication with the manifold 101 including delivery line components, such as, pressure regulator, pressure sensors, valves, gas filters piping, etc., which are fluidly connected to the etching chamber 128. The cylinder 106 contains FNO gas having a purity of 99%. The cylinder 106 made of NiP coated steel. The cylinder 106 is a carbon steel cylinder made of alloy 4130X with an internal surface coating of nickel plating and the internal surface of the nickel plating is polished.

The cylinder valve 108 may be an alloy having nickel content >14%, preferably the cylinder valve 108 is HASTELLOY® or other nickel alloys. In one exemplary embodiment, the cylinder valve 108 may specifically use HASTELLOY® materials, in which metal impurities (such as Fe, Ni, Cr, Mn) are less than 1 ng/mL. High pressure FNO or $FNO/N_2$ mixture is more corrosive than low-pressure one. Thus, the high pressure $FNO/N_2$ mixture in a special package is designed to have a NiP coated steel cylinder 106 communicate with a nickel alloy manifold 101 up to the pressure regulator 116, where the pressure regulator 116 is applied to reduce the pressure. In this way, the depressurized $FNO/N_2$ mixture is less corrosive down the low-pressure zone 104 and the etching chamber 128. With this setup, the cylinder valve 108 composed of nickel was found to have less corrosion/powder formation. The cylinder 106 composed of NiP coated steel has very smooth surface and lower moisture.

The packaging shown in FIG. 2 may also be used to store and deliver $F_3NO$-free FNO gas mixture formed by mixing $F_3NO$-free FNO gas with an additional etching gas, such as $F_2$. In this case, the $F_3NO$-free FNO gas mixture is $F_3NO$-free FNO and $F_2$.

The disclosed systems for storage and delivery of $F_3NO$-free FNO gas and $F_3NO$-free FNO gas mixture (e.g., a gas mixture of $F_3NO$-free FNO and $F_2$) include a passivation process with the cylinder 106, the cylinder valve 108, the low-pressure zone 104 of manifold assembly 101 to reduce metal impurities delivery into the etching chamber 128. The passivation process may be done with FNO gas or $F_2$ gas. In the high-pressure zone 102, a passivation process for the line components may or may not work due to the high pressure. Thus, high nickel content materials are applicable for making of the line components in the high-pressure zone. In the low-pressure zone 104, a passivation process may apply.

The disclosed systems and methods also include systems and methods of etching semiconductor structures using the disclosed $F_3NO$-free FNO gas and/or $F_3NO$-free FNO gas mixtures. The disclosed etching systems and methods include thermal etching, plasma dry etching including ALE (atomic layer etching), or the like. The disclosed $F_3NO$-free FNO gas and/or $F_3NO$-free FNO gas mixtures are applied to thermal and plasma dry etching processes. The disclosed $F_3NO$-free FNO gas may be used as etching gas alone (pure) or diluted in an inert gas, for example, $N_2$, Ar, He, Xe, etc. The concentration of the diluted $F_3NO$-free FNO may be less than 15%, preferably less than 10%, more preferably less than 5%, even more preferably less than 1%. In one embodiment, the concentration of the diluted $F_3NO$-free FNO may be diluted to 0.01%. The disclosed $F_3NO$-free FNO gas may also be used as etching gas mixed with an additional etching gas, such as, $F_2$, HF, $cC_4F_8$, $C_4F_6$, $C_4F_8$, $C_5F_8$, $CF_4$, $CH_3F$, $CF_3H$, $CH_2F_2$, COS, $CS_2$, $CF_3I$, $C_2F_3I$, $C_2F_5I$, CFN, $SO_2$, NO, $O_2$, $CO_2$, CO, $NO_2$, $N_2O$, $O_3$, $Cl_2$, $H_2$, HBr, and combination thereof. Preferably, the disclosed $F_3NO$-free FNO gas is used as etching gas mixed with $F_2$.

Exemplary other gases include, without limitation, oxidizers such as $O_2$, $O_3$, CO, $CO_2$, COS, NO, $N_2O$, $NO_2$, $SO_2$, and combinations thereof. The disclosed etching gases and the oxidizer may be mixed together prior to introduction into the reaction chamber or the etching chamber.

Alternatively, the oxidizer may be introduced continuously into the reaction chamber and the etching gas introduced into the reaction chamber in pulses. Alternatively, both the oxidizer and the etching gas may be introduced continuously into the reaction chamber. The oxidizer may comprise between approximately 0.01% by volume to approximately 99.99% by volume of the mixture introduced into the chamber (with 99.99% by volume representing introduction of almost pure oxidizer for the continuous introduction alternative).

In one embodiment, the disclosed $F_3NO$-free FNO gas diluted in $N_2$ (i.e., $FNO/N_2$) and mixed with an additional etching gas $F_2$ (i.e., $FNO/N_2/F_2$ mixture). The disclosed $F_3NO$-free FNO gas mixtures $FNO/N_2/F_2$ may comprise greater than 10% by volume of FNO, preferably greater than 15% by volume FNO.

The disclosed $F_3NO$-free FNO etching gas and the additional gas (e.g., $F_2$) may be mixed prior to introduction to the reaction chamber. The additional etching gas may comprise between approximately 0.01% by volume to approximately 99.99% by volume of the mixture introduced into the chamber.

The disclosed $F_3NO$-free FNO gas are provided at equal to or greater than 99% v/v by volume purity, preferably at greater than 99.99% v/v by volume purity, and more preferably at greater than 99.999% v/v by volume purity. The disclosed $F_3NO$-free FNO gas contain equal to or less than 1% by volume trace gas impurities, with less than 150 ppm by volume of impurity gases, such as $H_2O$, $NO_2$, $N_2O$ and/or $CO_2$, contained in said trace gas impurities. Preferably, the water content in the disclosed $F_3NO$-free FNO gas is less than 20 ppm by weight.

The disclosed $F_3NO$-free FNO gas contains less than 1% by volume, preferably less than 0.1% by volume, more preferably less than 0.01% by volume of $F_3NO$, which may provide precise etching performance and better process repeatability.

The disclosed $F_3NO$-free FNO gas and $F_3NO$-free FNO gas mixtures may be used to thermal etch or plasma dry etch silicon-containing films, such as SiN film, capped on top of a semiconductor structure, such as, a 3D NAND flash memory or a DRAM memory. The disclosed $F_3NO$-free FNO gas and $F_3NO$-free FNO gas mixtures may also be used to thermal etch or plasma dry etch silicon-containing films on a substrate, such as, SiN layer. The disclosed thermal etching or plasma dry etching method may be useful in the manufacture of semiconductor devices such as NAND or 3D NAND gates or Flash or DRAM memory or transistors such as fin-shaped field-effect transistor (FinFET), Lateral Gate-All-Around (LGAA) devices and Vertical Gate-All-Around (VGAA) devices, Bulk complementary metal-oxide-semiconductor (Bulk CMOS), fully depleted silicon-on-insulator (FD-SOI) structures, Monolithich 3D (M3D). The disclosed $F_3NO$-free FNO gas and $F_3NO$-free FNO gas mixtures may be used in other areas of applications, such as different front end of the line (FEOL) and back end of the line (BEOL) etch applications and low k applications as well. Additionally, the disclosed F₃NO-free FNO gas and F₃NO-free FNO gas mixtures may also be used for etching Si in 3D through silicon aperture (TSV) etch applications for interconnecting memory to logic on a substrate. The disclosed F₃NO-free FNO gas and F₃NO-free FNO gas mixtures may be used to remove a layer of deposits or a film formed on the inner surface of a deposition chamber after a deposition process. Such a process refers to a cleaning process after deposition.

The disclosed etching method includes providing a reaction chamber having a substrate having a film disposed thereon or deposits (or film) on the internal surface of the chamber wall. The reaction chamber may be any enclosure or chamber within a device in which etching methods take place such as, and without limitation, any chambers or enclosures used for plasma etching, such as, reactive ion etching (RIE), capacitively coupled plasma (CCP) with single or multiple frequency RF sources, inductively coupled plasma (ICP), Electron Cyclotron Resonance (ECR) or microwave plasma reactors, or other types of etching systems capable of selectively removing a portion of the silicon-containing film. The chamber can be also a chamber for deposition process with one or more gas inlet for different precursors. The chamber for deposition usually has controllable temperature on the substrate holder and maybe a buffer chamber between reaction chamber and gas inlet. The pressure of chamber is controlled by pump system. Suitable pre-synthesized reaction chambers include but are not limited to the Applied Materials magnetically enhanced reactive ion etcher sold at the trademark eMAX™, the Lam Research CCP reactive ion etcher dielectric etch product family sold at the trademark 2300® Flex™ or Tokyo Electron deposition systems sold at the trademarks INDY™, INDY PLUS™ and NT333™. The reaction chamber may be heated to a temperature ranging from room temperature to approximately 1000° C. Preferably from room temperature to 600° C., more preferably from 100 to 300° C. Depending on application targets, the temperature may be approximately 100° C., 500° C. or 600° C. This kind of thermal etcher can introduce molecules by different ways such as flow through, shower head, or other design. There will be a gas outlet connecting to a pumping system that controls the pressure of the chamber.

The disclosed F₃NO-free FNO gas and F₃NO-free FNO gas mixtures are suitable for etching semiconductor structures including thermal etching and plasma dry etching, such as, channel holes, gate trenches, staircase contacts, capacitor holes, contact holes, etc., in the silicon-containing films. For thermal etching, the disclosed F₃NO-free FNO gas and F₃NO-free FNO gas mixtures may be applied for isotropic etching purpose in a thermal reactor. For plasma etching, the disclosed F₃NO-free FNO gas and F₃NO-free FNO gas mixtures are not only compatible with currently available mask materials but also compatible with the future generations of mask materials because the disclosed F₃NO-free FNO gas and mixtures induce little to no damage on the mask along with good profile of high aspect ratio structures. In other words, the disclosed F₃NO-free FNO gas and F₃NO-free FNO gas mixtures may produce vertical etched patterns having minimal pattern collapse or roughness. Preferably, the disclosed F₃NO-free FNO gas and F₃NO-free FNO gas mixtures etching compositions are suitably stable during the etching process for delivery into the reactor/chamber.

The reaction chamber may contain one or more than one substrate. The substrates may be any suitable substrates used in semiconductor, photovoltaic, flat panel or LCD-TFT device manufacturing. Examples of suitable substrates include wafers, such as silicon, silica, glass, or GaAs wafers. The wafer will have multiple films or layers on it from previous manufacturing steps, including silicon-containing films or layers. The layers may or may not be patterned.

The disclosed F₃NO-free FNO etching gas is introduced into the reaction chamber containing the substrate. The gas may be introduced to the chamber at a flow rate ranging from approximately 0.1 sccm to approximately 30 slm. One of ordinary skill in the art will recognize that the flow rate may vary from tool to tool and application to application.

The disclosed F₃NO-free FNO etching gas may be supplied either in neat form or in a blend with an inert gas, such as $N_2$, Ar, He, Xe, etc. The disclosed F₃NO-free FNO etching gas may be present in varying concentrations in the blend.

FTIR, microscope analyses, pressure monitoring (pressure sensor), ellipsometer, Energy-dispersive X-ray spectroscopy (EDX), Inductively coupled plasma mass spectrometry (ICP-MS), analytical electron microscopy (AEM), X-ray photoelectron spectroscopy (XPS), Scanning Electron Microscope (SEM), Transmission electron microscopy (TEM) or other measurement tools may be used to monitor changes of compositions and etching performance using the disclosed F₃NO-free FNO etching gas to etch the semiconductor structures, and also monitor the thermally activated etching gas from the chamber exhaust to determine the degradation of materials of the cylinder, the cylinder valve and the line components in the manifold assembly.

The disclosed F₃NO-free FNO etching gas may be mixed with other gases either prior to introduction into the reaction chamber or inside the reaction chamber. Preferably, the gases may be mixed prior to introduction to the chamber in order to provide a uniform concentration of the entering gas.

In another alternative, the disclosed F₃NO-free FNO etching gas may be introduced into the chamber independently of the other gases such as when two or more of the gases react.

In another alternative, the disclosed F₃NO-free FNO etching gas and the inert gas are the only two gases that are used during the etching process.

The temperature and the pressure within the reaction chamber are held at conditions suitable for the film on the substrate to react with the etching gas. For instance, the pressure in the chamber may be held between approximately 0.1 mTorr and approximately 1000 Torr, preferably between approximately 1 Torr and approximately 400 Torr, as required by the etching parameters. Likewise, the substrate temperature in the chamber may range between approximately room temperature to approximately 1000° C. depending on the process requirements. Preferably from room temperature to 600° C., more preferably from 100 to 300° C. Depending on application targets, the temperature may be approximately 100° C., 500° C. or 600° C.

EXAMPLES

The following non-limiting examples are provided to further illustrate embodiments of the invention. However, the examples are not intended to be all inclusive and are not intended to limit the scope of the inventions described herein.

In the following examples, FTIR spectra were collected with Thermo NICOLET6700 with cell length: 6.4 mm; cell temperature: 40° C.; cell pressure: 10 Torr; scan: 10 times and 2 $cm^{-1}$ resolution. In the following examples, the etching gas was selected from F₃NO-free FNO-only and/or $F_3NO$-free $FNO/F_2/N_2$ gas mixture. The $F_3NO$-free $FNO/F_2/N_2$ gas mixture contained about 15% $F_3NO$-free FNO and about 10% $F_2$ in $N_2$.

Example 1 Pre-Synthesized $F_3NO$-Free FNO

The pre-synthesized $F_3NO$-free FNO gas has a purity of 99% FNO. Impurities in the pre-synthesized $F_3NO$-free FNO gas may include $F_3NO$, $NO_2$, $N_2O$, etc. $NO_2$ and $N_2O$ may come from NO cylinder aging. $F_3NO$ impurity is less than 1%. From the example that follows, FNO diluted in an inert gas, for example, $N_2$ gas, may suppress $F_3NO$ formation when producing FNO in situ with $F_2$ and NO. Furthermore, depending on semiconductor applications, FNO gas either mixed with one or more addition etching gases or diluted in an inert gas. Thus, the FNO-containing etching gas formed by the pre-synthesized $F_3NO$-free FNO will contain even less $F_3NO$ impurity. For example, if a FNO-containing etching gas formed by the pre-synthesized $F_3NO$-free FNO contains 15% pre-synthesized $F_3NO$-free FNO, the $F_3NO$ impurity will be less than 0.15%. Thus, the FNO-containing etching gas formed by the pre-synthesized $F_3NO$-free FNO will contains less to no $F_3NO$.

Example 2 $F_3NO$-Free FNO Produced In Situ

Besides the pre-synthesized $F_3NO$-free FNO, $F_3NO$-free FNO may be produced in situ with starting materials $F_2$ and NO through the reaction of $F_2+2NO\rightarrow 2FNO$. In order to suppress the formation of $F_3NO$ impurity in the product FNO, the reaction of $F_2$ and NO is at stoichiometry condition, that is, the ratio of the reactants $F_2$ and NO is equals to approximately ½. To ensure less to no $F_3NO$ formed, the ratio of the reactants $F_2$ and NO may be less than approximately ½.

Figure 3A:
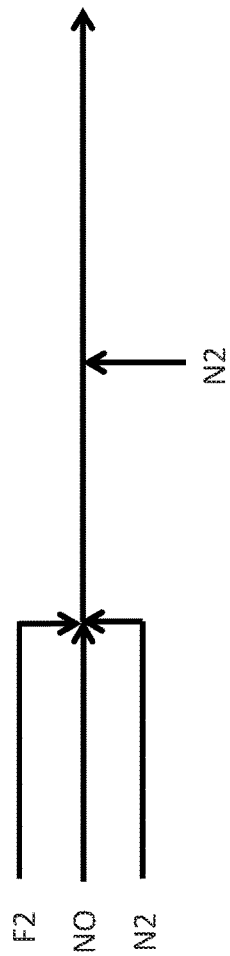
FIG. 3(a) is an order of mixing $F_2$, NO and $N_2$ to produce FNO in $N_2$.

The produced $F_3NO$-free FNO gas may be diluted in an inert gas for using as etching gas in semiconductor applications. The inert gas may be $N_2$, Ar, He, Ne, Kr, Xe. In one embodiment, $F_3NO$-free FNO gas may be diluted with $N_2$, forming $F_3NO$-free FNO and $N_2$ gas mixture. The $F_3NO$-free FNO and $N_2$ gas mixture may be produced by mixing $F_2$, NO and $N_2$ at a molar ratio of $F_2/NO\leq ½$ with required $N_2$ amount depending on application requirements of FNO concentration. The orders of mixing $F_2$, NO and $N_2$ to form the $F_3NO$-free FNO and $N_2$ gas mixture are shown in FIG. 3(a) to FIG. 3(d). The key point for the mixing orders is the ratio of $F_2$ to NO is at stoichiometry condition, that is, equals to approximately ½, or less than approximately ½. FIG. 3(a) shows the three components $F_2$, NO and $N_2$ are mixed in a reactor simultaneously and then excess $N_2$ is added to the reactor. This is equivalent to the reactants $F_2$ and NO are initially diluted in $N_2$ to produce a product FNO in $N_2$ and the produced FNO is then further diluted in $N_2$. The reaction equation is $2NO+F_2\rightarrow 2FNO$. With equal to or less than equivalent of $F_2$ in the reactants, FNO is produced and the formation of $F_3NO$ may be controlled. For example, feeding a mixture of $F_2$, NO and $N_2$, formed with 7.5 sccm $F_2$, 15 sccm NO and 75 sccm $N_2$, to a reactor, where the reaction between $F_2$ and NO occurs to form the product FNO diluted in $N_2$. Since the ratio of $F_2$ to NO is =½, all $F_2$ will be consumed to produce FNO and no $F_2$ remains to generate $F_3NO$. In this way, $F_3NO$ formation may be restrained and the produced FNO is $F_3NO$-free FNO. More $N_2$ (10 sccm) is then added to the reactor resulting in the $F_3NO$-free FNO diluted in $N_2$, thereby forming a gas mixture of 15% $F_3NO$-free FNO in $N_2$.

Figure 3B:
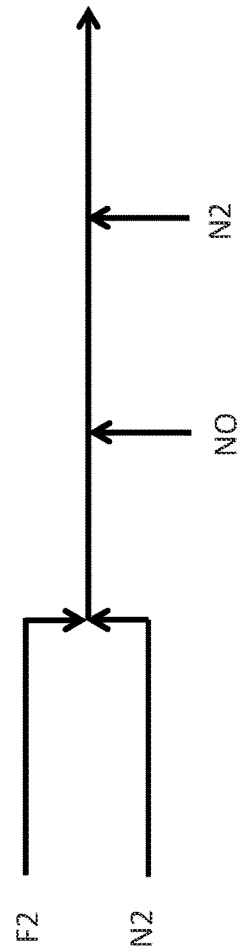
FIG. 3(b) is another order of mixing F₂, NO and N₂ to produce FNO in N₂.

Alternatively, the gas mixture of $F_3NO$-free FNO and $N_2$ may be produced by mixing $F_2/N_2$ and NO at a molar ration of $F_2/NO\leq ½$. The order of mixing $F_2$, $N_2$ and NO is shown in FIG. 3(b). A mixture of $F_2$ and $N_2$ is formed first and then NO is added into the mixture, in which the reaction of $F_2$ and NO occurs to produce FNO in $N_2$. Additional $N_2$ is then added to the product FNO forming FNO diluted in $N_2$. The reaction equation is $2NO+F_2\rightarrow 2FNO$. With equal to or less than equivalent of $F_2$ in the reactants, the formation of $F_3NO$ may be controlled. For example, a mixture of $F_2$ and $N_2$ is formed with 7.5 sccm $F_2$ and 75 sccm $N_2$ fed to a reactor. The mixture is then mixed with 15 sccm NO in the reactor where the reaction between $F_2$ and NO occurs to form the product $F_3NO$-free FNO. The product $F_3NO$-free FNO is then diluted in $N_2$ with 10 sccm $N_2$ forming a gas mixture of 15% FNO diluted in $N_2$.

Figure 3C:
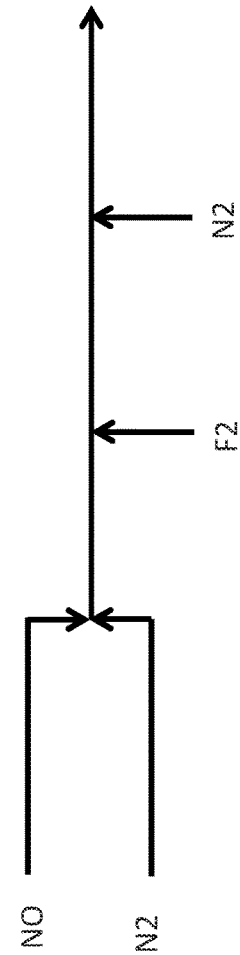
FIG. 3(c) is another order of mixing F₂, NO and N₂ to produce FNO in N₂.

Alternatively, the gas mixture of $F_3NO$-free FNO and $N_2$ may be produced by mixing $F_2$ and $NO/N_2$ at a molar ratio of $F_2/NO\leq ½$. The order of mixing $F_2$, $N_2$ and NO is shown in FIG. 3(c). A mixture of NO and $N_2$ is formed first and then $F_2$ is added into the mixture, in which the reaction of $F_2$ and NO occurs to produce FNO in $N_2$. Additional $N_2$ is then added to the product FNO forming FNO further diluted in $N_2$. The reaction equation is $2NO+F_2\rightarrow 2FNO$. With equal or less equivalent of $F_2$ in the reactants, the product FNO is produced and the formation of $F_3NO$ may be controlled.

Figure 3D:
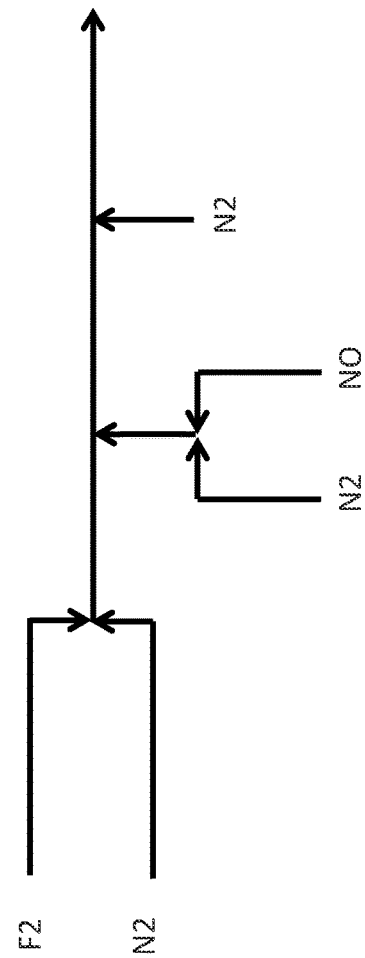
FIG. 3(d) is another order of mixing F₂, NO and N₂ to produce FNO in N₂.

Alternatively, the gas mixture of $F_3NO$-free FNO and $N_2$ may be produced by mixing $F_2/N_2$ and $NO/N_2$ at condition of $F_2/NO\leq ½$, in which $F_2$ and NO are diluted in $N_2$, respectively. The order of mixing $F_2$, $N_2$ and NO is shown in FIG. 3(d). A mixture of $F_2$ and $N_2$ is formed first and then a mixture of NO and $N_2$ is added into the mixture of $F_2$ and $N_2$, in which the reaction of $F_2$ and NO occurs to produce FNO in $N_2$. Additional $N_2$ is then added to the product FNO in $N_2$ forming a different concentration of FNO in $N_2$. The reaction equation is $2NO+F_2\rightarrow 2FNO$. With equal to or less than equivalent of $F_2$ in the reactants, the product FNO is produced and the formation of $F_3NO$ may be controlled.

Example 3 Stoichiometric Condition Versus $F_2$-Rich Condition

Figure 4:
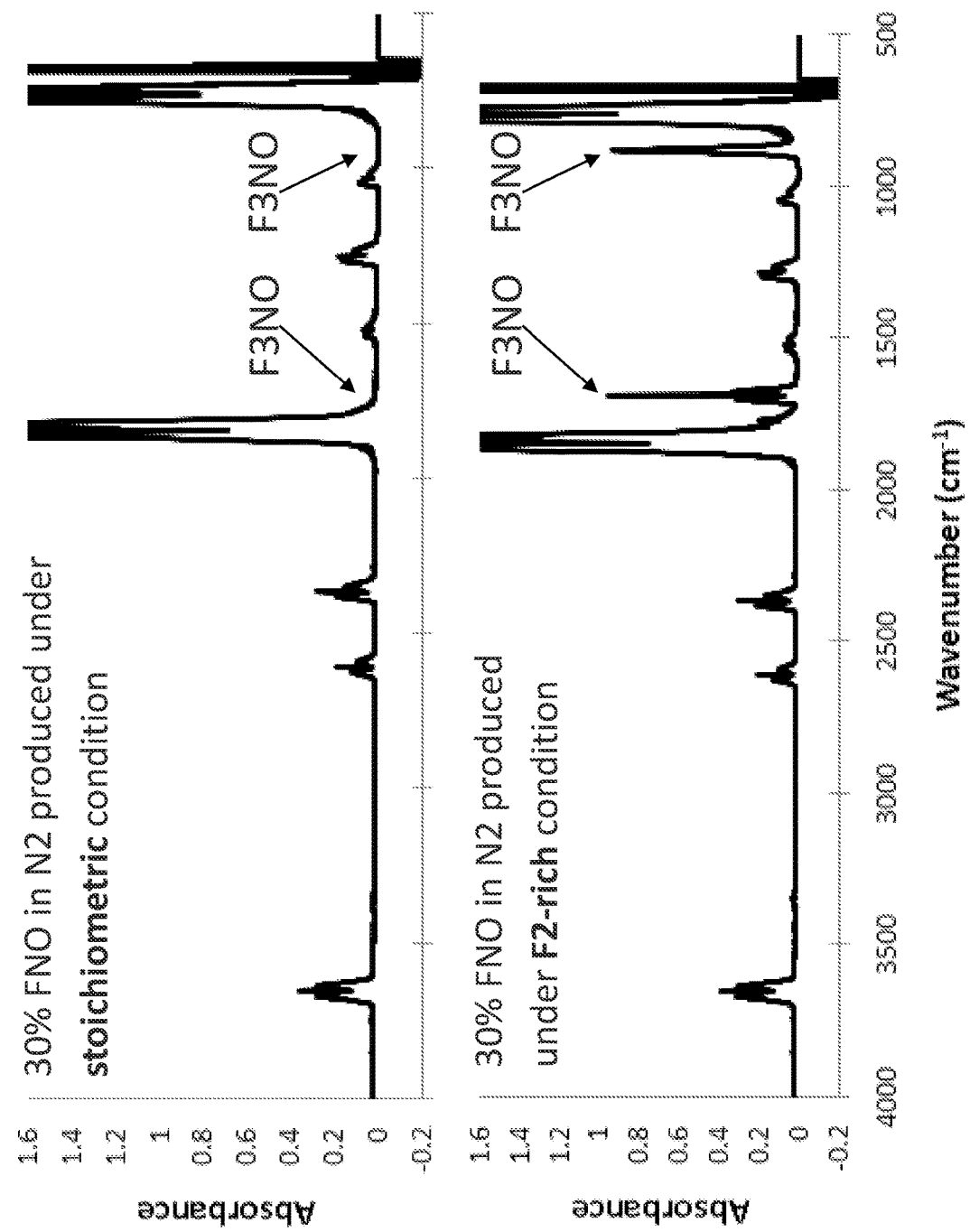
FIG. 4 is a comparison of FT-IR spectra of F₃NO impurity in 30% FNO in N₂ produced from on-site synthesis under stoichiometric condition versus 30% FNO in N₂ produced from on-site synthesis under F₂-rich condition.

The resulting products from Example 2 were analyzed by FT-IR and identified less to no trace of $F_3NO$ in the product, since the ratio of $F_2$ to NO is ≤½, all $F_2$ will be consumed to produce FNO and no $F_2$ remains for generating $F_3NO$. FIG. 4 is a comparison of FTIR spectra of 30% FNO in $N_2$ produced at stoichiometric condition and at $F_2$-rich condition, respectively. The upper spectrum is 30% FNO produced at stoichiometric condition; the lower spectrum is 30% FNO produced at $F_2$-rich condition. No $F_3NO$ peaks were detected if FNO is manufactured under stoichiometric condition.

Example 4 Manufacturing Gas Mixture of $F_3NO$-Free FNO and $F_2$ in $N_2$ In Situ (I)

The $F_3NO$-free FNO gas produced in situ may be mixed with an additional etching gas, such as, $F_2$, for using as etching gas in semiconductor applications. In order to suppress the formation of $F_3NO$ in the process of producing the gas mixture of $FNO/F_2/N_2$, the mixing procedure was conducted with controlling $F_2$ mixing order.

Figure 5A:
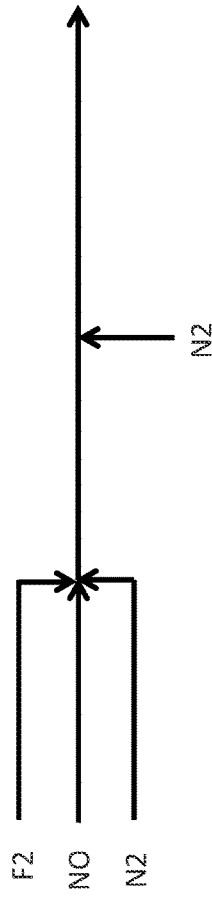
FIG. 5(a) is an order of mixing F₂, NO and N₂ to produce a gas mixture of F₃NO-free FNO/F₂/N₂.
Figure 5B:
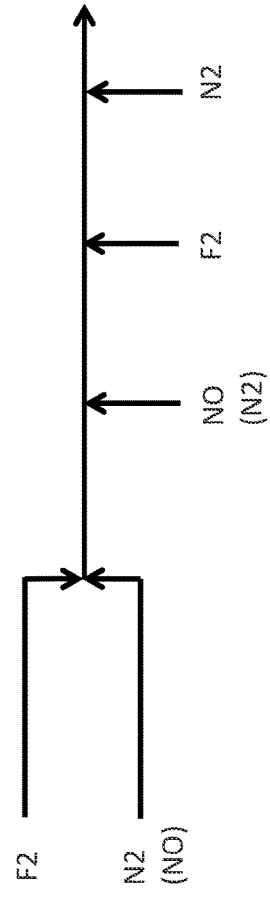
FIG. 5(b) is another order of mixing F₂, NO and N₂ to produce F₃NO-free FNO/F₂/N₂ gas mixture.
Figure 5C:
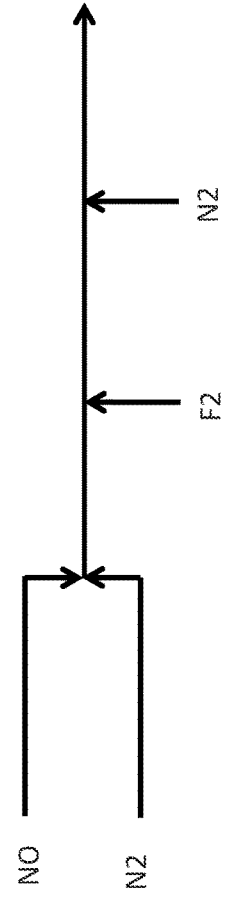
FIG. 5(c) is another order of mixing F₂, NO and N₂ to produce a gas mixture of F₃NO-free FNO/F₂/N₂.
Figure 5D:
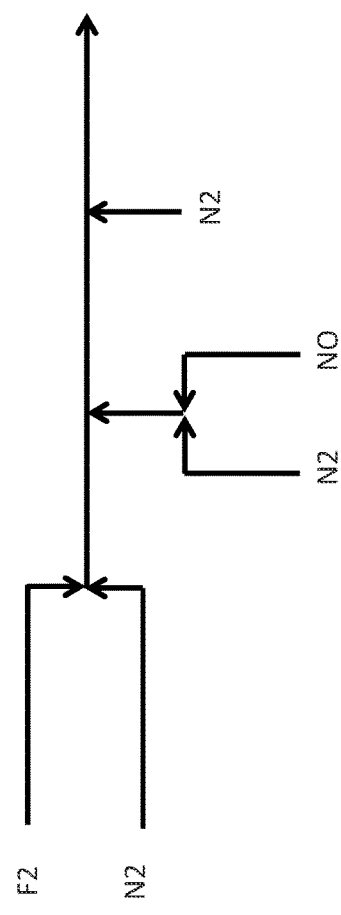
FIG. 5(d) is another order of mixing F₂, NO and N₂ to produce a gas mixture of F₃NO-free FNO/F₂/N₂.

The gas mixture of $F_3NO$-free $FNO/F_2/N_2$ may be produced by different mixing orders of $F_2$, NO and $N_2$. FIG. 5(a) shows $F_2$, NO and $N_2$ are mixed together first and then additional $N_2$ is added. In order to get target $F_2$ composition in the gas mixture of $F_3NO$-free $FNO/F_2/N_2$, $F_2/NO$ ratio has to be larger than ½. Alternatively, the gas mixture of $F_3NO$-free $FNO/F_2/N_2$ may be produced by mixing $F_2$ and $N_2$ first, then adding NO at condition of $F_2/NO \le ½$ to produce FNO and then adding additional $F_2$, and additional $N_2$, as shown in FIG. 5(b). In this case, the mixing order of $N_2$ and NO may be interchangeable. That is, mixing $F_2$ and NO first and then adding $N_2$ (see parentheses). Alternatively, the gas mixture of $F_3NO$-free $FNO/F_2/N_2$ may be produced by mixing NO and $N_2$ first, then adding $F_2$ and then adding additional $N_2$, as shown in FIG. 5(c). In this case, $F_2/NO$ ratio has also to be larger than % A to reach the target $F_2$ composition the gas mixture of $F_3NO$-free $FNO/F_2/N_2$. Alternatively, the gas mixture of $F_3NO$-free $FNO/F_2/N_2$ may be produced by mixing $F_2$ and $N_2$ first, then adding a mixture of NO and $N_2$ at condition of $F_2/NO = ½$ and then adding additional $N_2$, as shown in FIG. 5(d). Similarly, in this case, $F_2/NO$ ratio has also to be larger than ½ to reach the target $F_2$ composition the gas mixture of $F_3NO$-free $FNO/F_2/N_2$.

The mixing orders shown in FIG. 5(a), FIG. 5(c) and FIG. 5(d) are all one step $F_2$ mixing procedures at $F_2$-rich condition. As shown in FIG. 4, under $F_2$-rich condition, $F_3NO$ was produced and may not be suppressed. Mixing excess $F_2$ with NO in the one-step $F_2$ mixing procedure produces more $F_3NO$ than mixing $F_2$ and NO in the two-step $F_2$ mixing procedure. The mixing order shown in FIG. 5(b) is a two-step $F_2$ mixing procedure, which includes a post feeding $F_2$ or $F_2/N_2$ to target a final $F_2$ composition in the gas mixture of $F_3NO$-free $FNO/F_2/N_2$. Since in the first step $F_2/NO \le ½$ and $F_3NO$ is suppressed, adding additional amount of $F_2$ would not produce $F_3NO$. Thus, only the mixing procedure shown in FIG. 5(b) provides less to no $F_3NO$ generation in the gas mixture of $F_3NO$-free $FNO/F_2/N_2$.

In the processes of synthesizing the gas mixture of $F_3NO$-free $FNO/F_2/N_2$, it is discovered $F_3NO$ generation depending on $F_2$ and NO feeding molar ratio and $F_2$ mixing procedure/order. Feeding $F_2$ amount as needed (i.e., stoichiometry condition) for FNO formation produces least $F_3NO$ impurity. For producing a gas mixture of $FNO/F_2/N_2$, the two-step $F_2$ mixing procedure is applicable. The two-step $F_2$ mixing procedure is i) forming a mixture of $F_2$ and pure NO (at least 99.9% purity) by mixing chemical equivalent $F_2$ and NO first with or without dilution in $N_2$ and then ii) adding extra $F_2$ gas into the mixture with or without dilution in $N_2$. By the two-step $F_2$ mixing procedure, less to no $F_3NO$ was detected through FT-IR measurements in the formation of the gas mixture of $FNO/F_2/N_2$.

Figure 6:
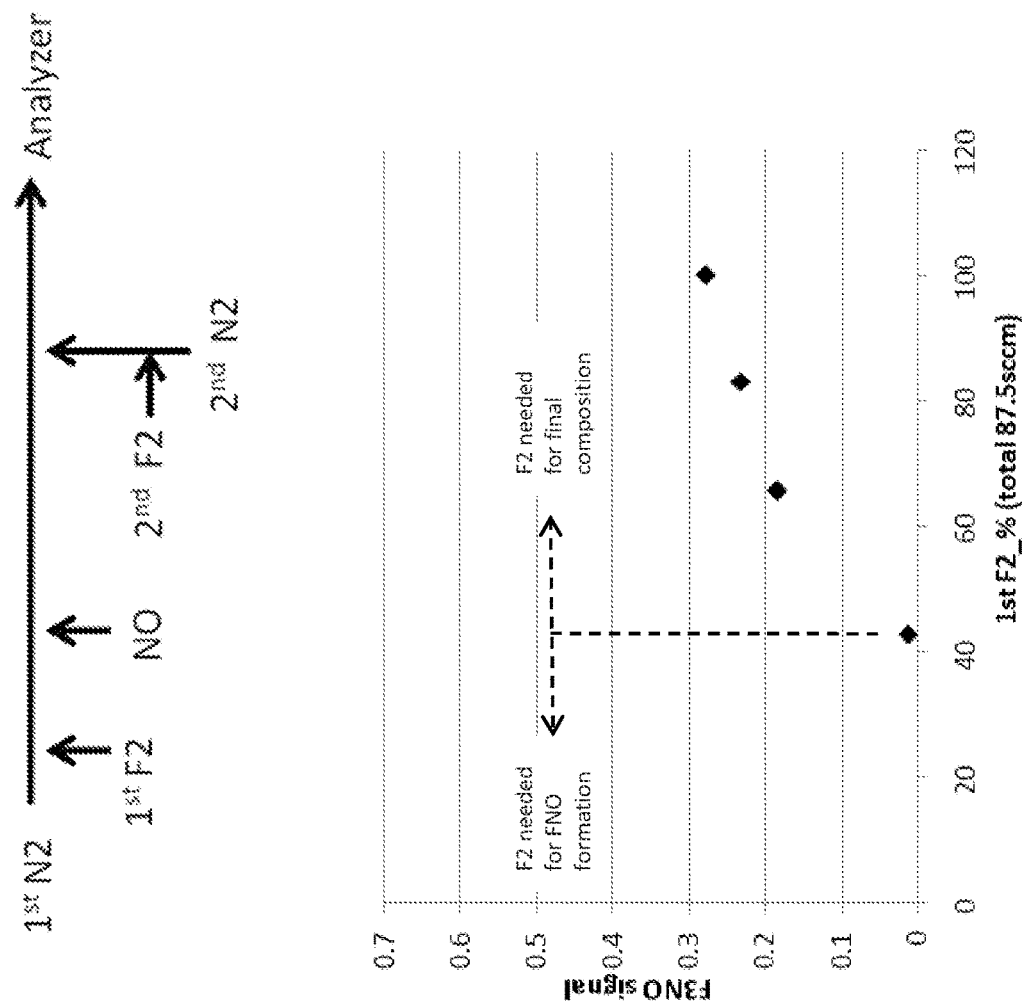
FIG. 6 is a data set of F₃NO formations with 1$^{st}$ F₂ feeding amount (%) versus total amount of F₂.

An example, a gas mixture of 15%-FNO and 10%-$F_2$ in $N_2$ balanced gas, was prepared by the two-step $F_2$ mixing procedures as shown in FIG. 5(b) and described in Table 1. $N_2$ and NO feedings were fixed at 10 mol and 2 mol, respectively. The ratio of $1^{st} F_2$ feeding to $2^{nd} F_2$ feeding ($1^{st} F_2/2^{nd} F_2$) was varied but a total flow rate of $F_2$ was fixed at 2.3 mol in order to target the same final composition of the $FNO/F_2/N_2$ gas mixture. $F_3NO$ amount in the $FNO/F_2/N_2$ gas mixture was monitored with FTIR to check the effect of $F_2$ mixing order, as shown in FIG. 6.

TABLE 1

Mixing procedures of $F_2$, NO and $N_2$ with a fixed amount of $F_2$

| $1^{st} F_2\_\%$ ($1^{st} F_2$/total $F_2$) | $1^{st} F_2$ (mol) | $1^{st} N_2$ (mol) | NO (mol) | $1^{st} F_2$/NO | $2^{nd} F_2$ (mol) | $2^{nd} N_2$ (mol) |
|---|---|---|---|---|---|---|
| 43% | 1 | 10 | 2 | 0.5 | 1.3 | 0 |
| 66% | 1.5 | 10 | 2 | 0.75 | 0.8 | 0 |

TABLE 1-continued

Mixing procedures of $F_2$, NO and $N_2$ with a fixed amount of $F_2$

| $1^{st} F_2\_\%$ ($1^{st} F_2$/total $F_2$) | $1^{st} F_2$ (mol) | $1^{st} N_2$ (mol) | NO (mol) | $1^{st} F_2$/NO | $2^{nd} F_2$ (mol) | $2^{nd} N_2$ (mol) |
|---|---|---|---|---|---|---|
| 83% | 1.9 | 10 | 2 | 0.95 | 0.4 | 0 |
| 100% | 2.3 | 10 | 2 | 1.15 | 0 | 0 |

In the first step, a ratio of $1^{st} F_2$/total $F_2$ feedings is 43% and a ratio of $F_2$ to NO needed for FNO formation is $F_2/NO = 0.5$. In the second step, a post feeding of $2^{nd} F_2$ is fed to the mixture of $F_2$ and NO to target the final $F_2$ composition (in this case, 10% $F_2$) in the $FNO/F_2/N_2$ gas mixture. FIG. 6 shows that $F_3NO$ formation changes (FTIR signals) with $F_2$ feeding amount ($1^{st} F_2\_\%$). With 43% $1^{st} F_2$/total $F_2$ feed, no $F_3NO$ was formed, because $F_2/NO$ is at stoichiometry condition. Others, 66%, 83% and 100% of $1^{st} F_2$/total $F_2$ feed, all generate $F_3NO$.

Example 5 Manufacturing Gas Mixture of $F_3NO$-Free FNO and $F_2$ in $N_2$ In Situ (II)

A gas mixture of 3.42%-FNO and 2.31%-$F_2$ in $N_2$ balanced gas ($F_3NO$-free $FNO/F_2/N_2$) was prepared by 2 step feedings of $F_2$, as shown in FIG. 5(b) with various mixing amounts of $1^{st} F_2$ and $2^{nd} F_2$, as described in Table 2. $1^{st} F_2$, NO and $2^{nd} F_2$ feedings were fixed at 1 mol, 2 mol, and 1.35 mol, respectively. The ratio of $1^{st} N_2/2^{nd} N_2$ was varied while a total flow of $N_2$ was fixed at 55.13 mol to target same final composition of the gas mixture. $F_3NO$ amount was monitored with FTIR to check the effect of $N_2$ mixing order as shown in FIG. 5(b), where $N_2$ was split into two feedings, $1^{st} N_2$ and $2^{nd} N_2$. The gas mixture of $F_3NO$-free $FNO/F_2/N_2$ may be obtained by the reaction between premixed $F_2/N_2$ and NO with $F_2/NO$ ratio at ½.

TABLE 2

Mixing procedures of $F_2$, $N_2$ and NO with a fixed amount of $N_2$

| $1^{st} N_2\_\%$ ($1^{st} N_2$/total $N_2$) | $1^{st} F_2$ (mol) | $1^{st} N_2$ (mol) | NO (mol) | $1^{st} F_2$/NO | $2^{nd} F_2$ (mol) | $2^{nd} N_2$ (mol) |
|---|---|---|---|---|---|---|
| 0% | 1 | 0 | 2 | 0.5 | 1.35 | 55.13 |
| 11% | 1 | 5.85 | 2 | 0.5 | 1.35 | 49.28 |
| 42% | 1 | 23.39 | 2 | 0.5 | 1.35 | 31.74 |
| 100% | 1 | 55.13 | 2 | 0.5 | 1.35 | 0 |

Figure 7:
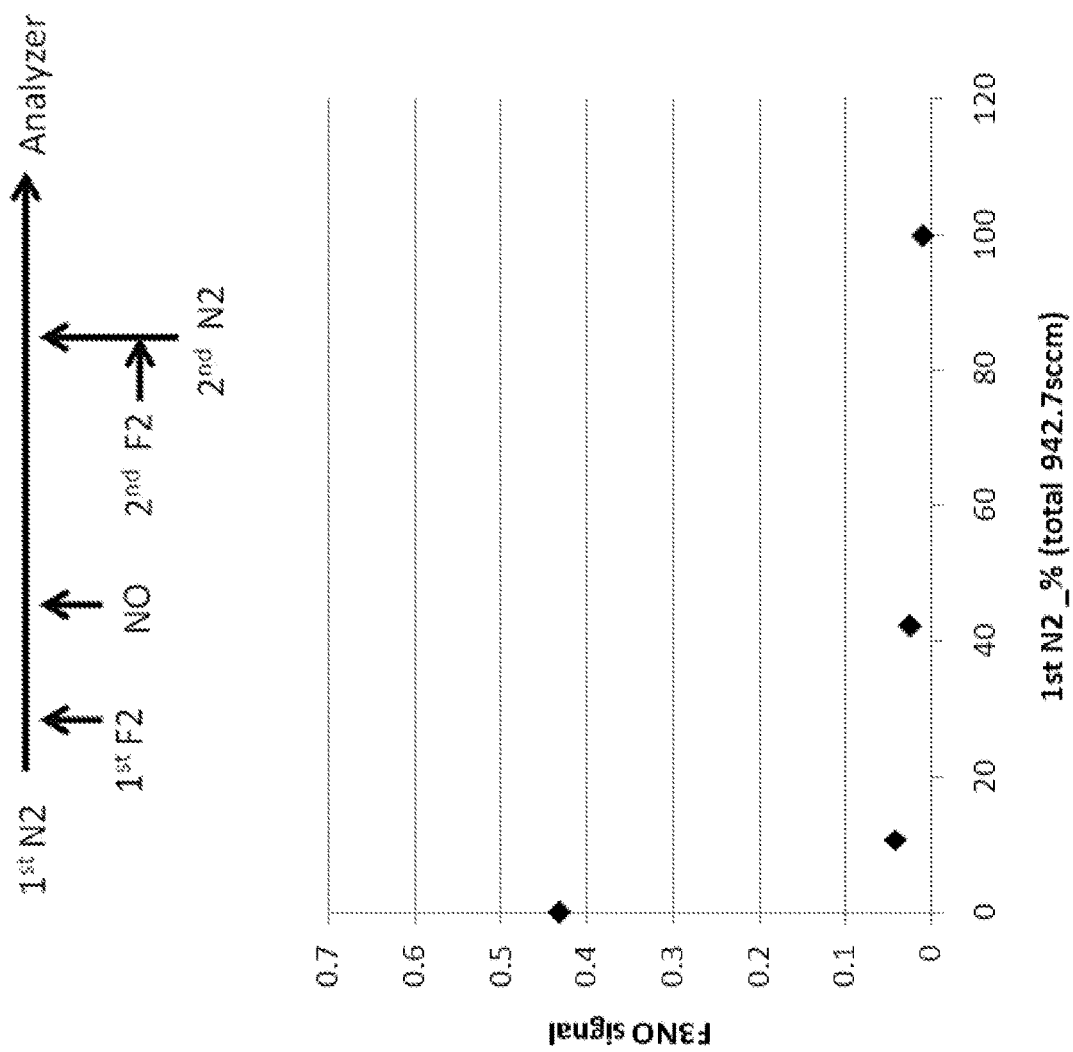
FIG. 7 is a data set of F₃NO formations with 1$^{st}$ N₂ feeding amount (%) versus total amount of N₂.

FIG. 7 shows $F_3NO$ formation changes (FTIR signals) with $N_2$ feedings and $N_2$ feeding amount ($1^{st} N_2\_\%$). Without $N_2$ feeding, $F_3NO$ was generated. With the increase of the ratio of $1^{st} N_2$ feeding to total $N_2$ feeding, $F_3NO$ formation was getting less and less and almost nil when $1^{st} N_2$ feeding reached 100%. Thus, adding $N_2$ is beneficial for reducing $F_3NO$ formation.

Example 6 Etching Effects with On-Site Mixing Produced $F_3NO$-Free FNO

The etching effects were done on SiN films using on-site mixing produced $F_3NO$-free FNO as etching gas.

Etching Effect of $1^{st} F_2$ Feeding $F_2$ was fed by two-steps, as shown in FIG. 5(b). Ratios of $1^{st} F_2$ to $2^{nd} F_2$ varied in order to produce FNO and various mixtures of FNO and $F_2$ for etching SiN films. Etching conditions are as follows. Pressure was 20 Torr; Temperature was 70° C.; Etching time was 2 min; Total flow rate was 1 slm fixed; Etching composition concentrations: FNO/$F_2$=1.48; FNO was 3.42% fixed, $F_2$ was 2.31% fixed; total $F_2$ was 40.2 sccm. Four SiN samples (1, 2, 3 and 4) were etched with different $1^{st}$ $F_2$ feeding amounts. A total of seven SiN films, listed in Table 3 were used for various etching tests.

TABLE 3

SiN film samples

| Sample | $1^{st}$ $F_2$/total $F_2$ | Total $F_2$ (sccm) | FNO (%) | Etch time (min) |
|---|---|---|---|---|
| 1 | 43% | 40.2 | 3.42 | 2 |
| 2 | 57% | 40.2 | 3.42 | 2 |
| 3 | 72% | 40.2 | 3.42 | 2 |
| 4 | 100% | 40.2 | 3.42 | 2 |
| 5 | 43% | 115.2 | 9.80 | 2 |
| 6 | 43% | 40.2 | 3.42 | 5 |
| 7 | 100% | 40.2 | 3.42 | 5 |

Figure 8:
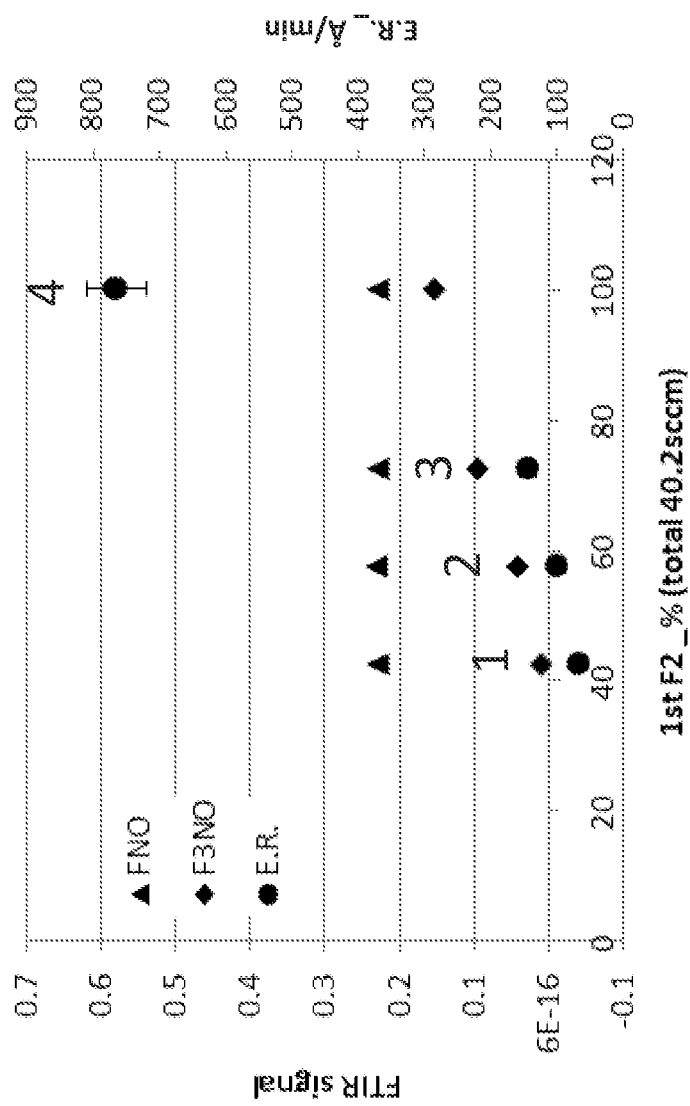
FIG. 8 is FTIR signals and etch rates after SiN etched with FNO and F₂ gas mixture with different F₂ mixing orders.

FIG. 8 are FTIR signals and etch rates after SiN etched with FNO and $F_2$ gas mixture with different $1^{st}$ $F_2$ feeding amounts. Clearly, more $F_3NO$ generated by more $1^{st}$ $F_2$ feeding leads to higher SiN etch rates, but not uniform etching results on SiN film surface (not shown). Sample 1, with 43% $1^{st}$ $F_2$ feeding, had the lowest amount of $F_3NO$; Samples 2 and 3, with 57% and 72% $1^{st}$ $F_2$ feedings, had $F_3NO$ gradually increasing. Sample 4 with 100% $1^{st}$ $F_2$ feeding, which had no $2^{nd}$ $F_2$ feeding meaning one step of $F_2$ mixing process, has the highest amount of $F_3NO$. For the four samples, etch rates were increased with the increase of $F_3NO$. Sample 1 has the lowest $F_3NO$ formation and good etching surface (not shown) comparing to the other three samples and the original SiN film. Thus, less to no $F_3NO$ impurity in FNO or less to no $F_3NO$ impurity in the gas mixture of FNO and $F_2$ benefits etching performance.

Etching Effect of $N_2$ Feeding

Figure 9:
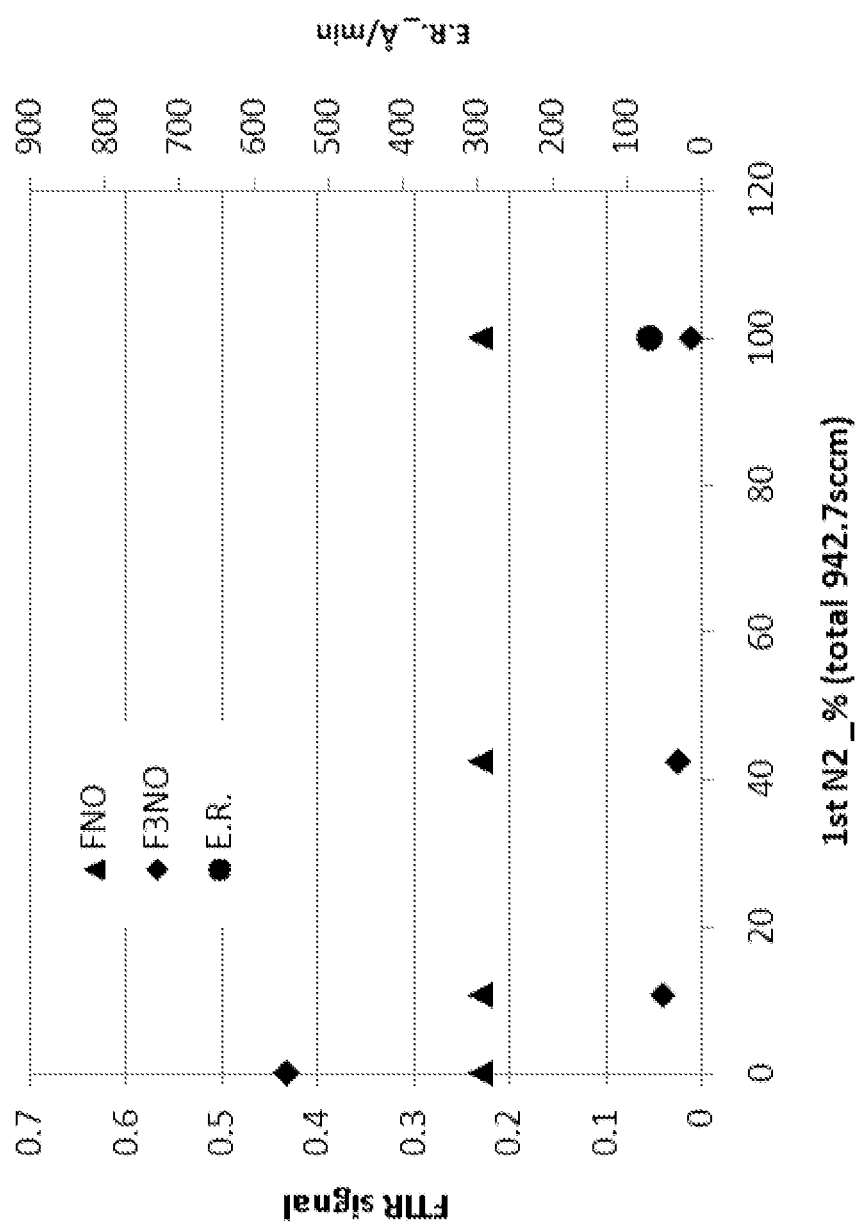
FIG. 9 is F₃NO formation with different N₂ mixing orders.

Etching conditions are as follows. Pressure was 20 Torr; Temperature was 70° C.; Etching time was 2 min; Total flow rate was 1 slm fixed; Etching composition concentrations: FNO/$F_2$=1.48; FNO was 3.42% fixed, $F_2$ was 2.31% fixed; total $N_2$ was 942.7 sccm. $N_2$ was fed by 2 steps, as shown in FIG. 5(a) and FIG. 5(c). Ratios of $1^{st}$ to $2^{nd}$ $N_2$ varied to produce FNO and a mixture of FNO and $F_2$ to etch SiN films. As shown in FIG. 9, without $N_2$ dilution, $F_3NO$ formed. Thus, $N_2$ dilution for $F_2$/NO reaction reduces $F_3NO$ formation.

Etching Effect of FNO and $F_2$ Concentrations

Etching composition contained FNO and $F_2$. FNO concentration was varied from 3.42% to 9.80%. $F_2$ concentration was varied from 2.31% to 6.62%. Etching conditions are as follows. Pressure was 20 Torr Temperature was 70° C.; Etching time was 2 min; Total flow rate was 1 slm fixed; Etching composition concentrations: FNO/$F_2$=1.48 with $1^{st}$ $F_2$ feeding amounts of 43% of total $F_2$.

Figure 10:
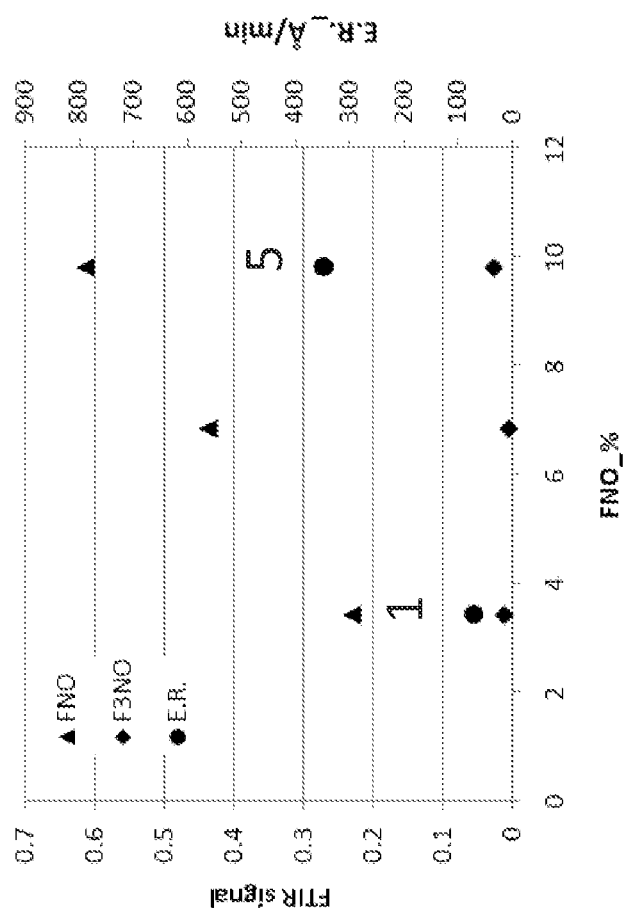
FIG. 10 is FTIR signals and etch rates versus FNO concentrations.

As shown in FIG. 10, increasing FNO concentration does not increase $F_3NO$ amount referring to Samples 1 and 5 in Table 3. The increase of SiN etch rate for Sample 5 is due to higher concentration of FNO than that of Sample 1. The etching surface colour for Sample 5 is quite different from Sample 1 (not shown), meaning low concentration of FNO and $F_2$ benefits the etching performance.

Effect of Etch Time

Etching conditions are as follows. Pressure was 20 Torr; Temperature was 70° C.; Total flow rate was 1 slm fixed; Etching composition concentrations: FNO/$F_2$=1.48; FNO was 3.42% fixed, $F_2$ was 2.31% fixed; total $F_2$ was 40.2 sccm. Etch time varied from 2 to 5 mins. Two steps $F_2$ mixing method, as shown in FIG. 5(b), was applied to form gas mixture of FNO/$F_2$/$N_2$.

Figure 11:
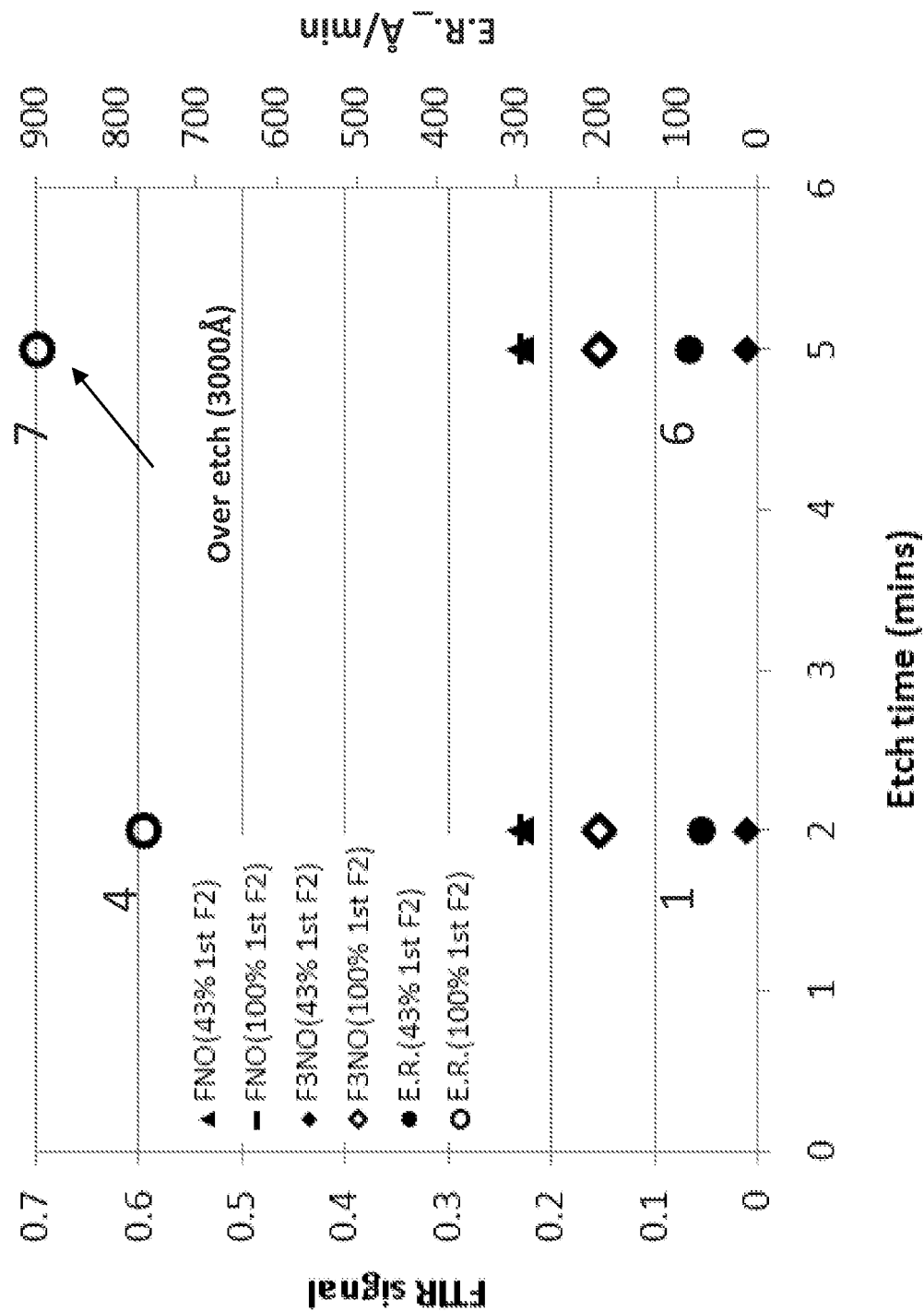
FIG. 11 is FTIR signals and etch rates versus etch time.

Referring to FIG. 11 and Table 3, samples 1 and 6 with 43% 1st $F_2$ had low $F_3NO$; samples 4 and 7 with 100% 1st $F_2$ had high $F_3NO$. As shown, no effect of etch time within 5 mins on the FNO and $F_3NO$ concentrations.

Example 7 Material Compatibility for Cylinder to Store FNO and for Line Components at High Pressure Material compatibility tests included testing the material compatibility between etching gas mixture FNO/$F_2$/$N_2$ with the storage cylinder 106 and the components in high-pressure zone 102 shown in FIG. 2, e.g., cylinder valve 108, pipeline 110, valve 112, pressure sensor 114 and pressure regulator 116.

The tested samples were HASTELLOY® C-22®, NiP, stainless steel gasket (such as stainless steel 316L (SS316L)) and Ni gasket at pressure 0.99 MPa.

XPS results show F-penetration up to 12000 Å in a vessel made of SS316L material. Thus, SS316L material may not be compatible with the etching gas mixture FNO/$F_2$/$N_2$.

XPS results show F-penetration up to approximately 6000 Å in a vessel made of HASTELLOY® C-22® material. Material HASTELLOY® C-22® is better than SS316L.

XPS results show F-penetration less than approximately 50 Å in a vessel made of NiP coated steel material. Thus, NiP coated steel material is compatible with the etching gas mixture FNO/$F_2$/$N_2$.

XPS results show F-penetration less than approximately 800 Å in a vessel made of nickel material. Although nickel material is not as good as NiP coated steel material, nickel material is somewhat compatible with the etching gas mixture FNO/$F_2$/$N_2$.

In summary, in the high-pressure zone (e.g., 0.99 MPa), NiP coated steel is good for making cylinder body. Pure nickel or nickel alloys may be used for cylinder valve. It may be preferred that other line components (e.g., pressure regulator, valves, gas filter, piping) in high-pressure zone may use nickel alloys, such as, HASTELLOY® C-22®•MONEL® or INCONEL®, which contain high Ni content. Passivation process with $F_2$ or FNO may be applied in the high-pressure zone. The passivation process includes a process that elevates pressure gradually.

Example 8 Material Compatibility Tests for Line Components at Low-Pressure

Material compatibility tests also included testing the material compatibility between etching gas mixture FNO/$F_2$/$N_2$ and the components in low-pressure zone 104 shown in FIG. 2, e.g., pressure sensor 120, pipeline 130, valves 122 and 124.

SS316L & Ni Material Compatibility

The vessels used herein were Ni vessels each containing a Ni gasket sample and one or two SS gasket (i.e., SS316L gasket) samples. The samples were tested at 0.50 MPa with the etching gas $F_3NO$-free FNO/$F_2$/$N_2$ in periods of 17 days and 21 days.

SS samples were covered with particles and corrosion was observed when exposed to $F_3NO$ free FNO/$F_2$/$N_2$. Thus, SS sample is not compatible with $F_3NO$-free FNO/$F_2$/$N_2$ even at low-pressure. No corrosion was observed on the nickel samples.

For FNO-only, SS sample was found compatible with FNO-only at low-pressure with no observed corrosion however for $F_3NO$-free $FNO/F_2/N_2$ it was found not as compatible in the low pressure zone. However, after passivation using $F_2$ or FNO, SS sample may be compatible with the etching gas $F_3NO$-free $FNO/F_2/N_2$ in the low-pressure zone. Alternatively, if the etching gas does not contains $F_2$, SS is suitable for making the line components in the low-pressure zone.

FNO and $F_2$ with Low Level of $F_3NO$ or $F_3NO$-Free

Two SS samples were installed in each of three vessels, respectively, at 0.5 MPa for 20 days. One vessel was fed with FNO-only, the other two were fed with the gas mixture of 15% $F_3NO$-free FNO and 10% $F_2$ in $N_2$ and half concentration of the gas mixture of 15% $F_3NO$-free FNO and 10% $F_2$ in $N_2$, for comparison. Even with $F_3NO$-free, the gas mixture of 15% $F_3NO$-free FNO and 10% $F_2$ in $N_2$ resulted in corrosion on SS316L at 0.5 MPa, but no corrosion with FNO only on SS316L surface. SS316L is not compatible with the gas mixture of 15% $F_3NO$-free FNO and 10% $F_2$ in $N_2$. Thus, $F_2$ or FNO passivation in low-pressure zone for $F_3NO$-free $F_2/FNO/N_2$ is needed. SS316L may be compatible with the etching gas $F_3NO$-free $FNO/F_2/N_2$ after $F_2$ or FNO passivation. SS316L may be compatible with the gas mixture of FNO and $N_2$ without $F_2$.

Example 9 Material Compatibility Summary

The material compatibility test conditions and results for both high pressure and low-pressure zones are listed in Table 4. In summary, high content nickel materials including NiP coated steel, pure nickel or nickel alloys, may be compatible with high-pressure zone. SS316L is compatible with FNO and $N_2$ gas mixture in the low-pressure zone. However, with $F_2$ or FNO passivation, SS316L may be compatible with $FNO/F_2/N_2$ gas mixture in the low-pressure zone. Furthermore, metals, metal alloys without nickel content or metal alloys with high nickel content or low nickel content may compatible with the low-pressure zone.

test. The cylinder was pre-treated with vacuum baking first and then passivated with $F_2$. 15% $FNO/N_2$ by mixing $F_2$, NO and $N_2$ as described in Example 3 was filled to the 10 L size NiP coated steel cylinder at 0.99 MPa(G). The shelf life test was done by monitoring FNO and impurities ($NO_2$, HF, $F_3NO$) with FT-IR for 6 months. The etching performance test was done by periodically checking SiN etch rate for 6 months and the stability of the product was confirmed up to 6 months in terms of composition and SiN etching performance.

Figure 12:
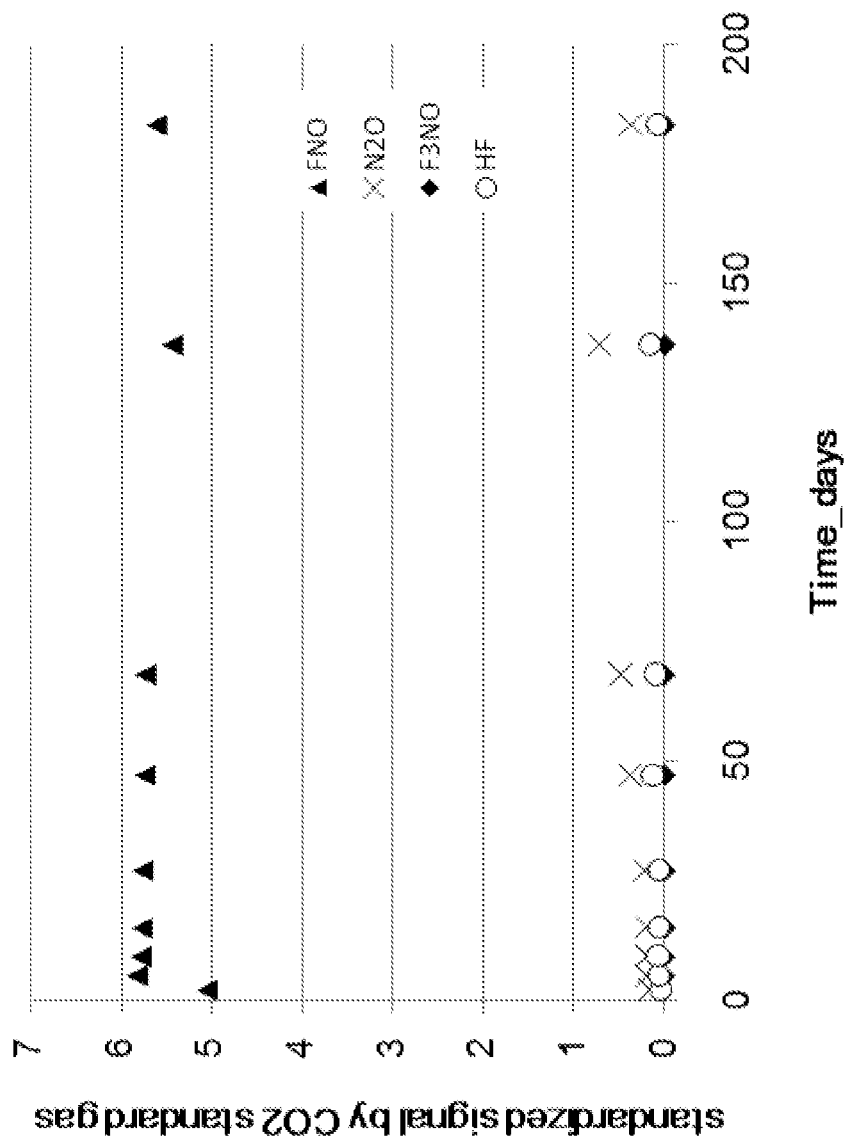
FIG. 12 is FTIR results of monitoring of different compositions.
Figure 13:
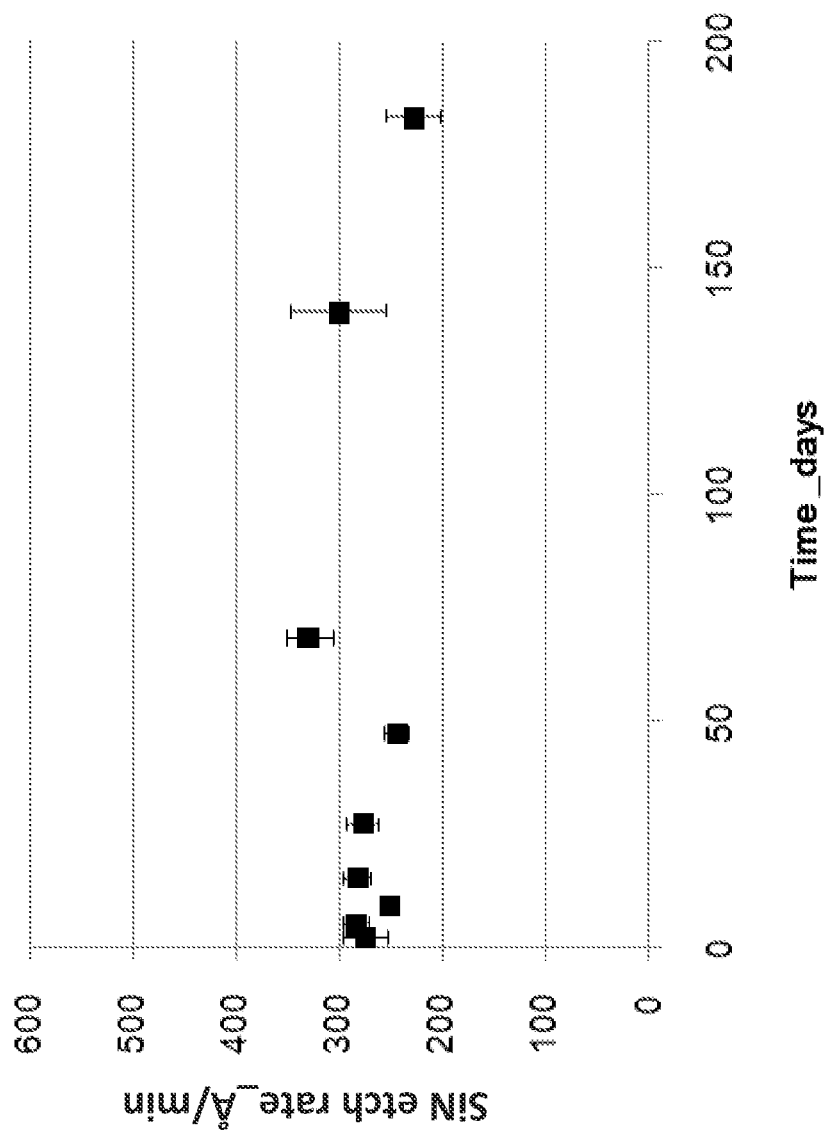
FIG. 13 is results of monitoring of etching performance.

FIG. 12 is the results of monitoring of different composition by FT-IR. FIG. 13 is the results of monitoring of etching performance over time. The etching performance was done with the etching gas of 20% $F_2$ and 1% FNO at temperature 100° C., pressure 20 Torr. The etching time was 1 min. The results from FIG. 12 and FIG. 13 show no significant concentration changes on FNO and impurities and no significant etching performance changes, meaning that 6-month stability is solid and long-term stability is promising.

Example 11 Storage and Supply Packaging for $F_3NO$-Free FNO-Containing Gas

Referring to FIG. 2, a packaging for storage and supply of $F_3NO$-free FNO-containing gas for thermal and plasma dry etching applications or the like in semiconductor industry may include a NiP coated steel cylinder for storage of $F_3NO$-free FNO-containing gas. The NiP coated steel cylinder may be a carbon steel cylinder made of alloy 4130X with an internal surface coating of nickel plating (NiP) and a polished surface of NiP coating. The supply packaging further include a nickel cylinder valve for controlling delivery of the $F_3NO$-free FNO-containing gas from the NiP coated steel cylinder to a manifold assembly that has a high-pressure zone and a low-pressure zone divided by a pressure regulator. Line components in the high-pressure zone are made of high nickel content material/alloy having at least 14% nickel by weight. The line components in the

TABLE 4

| Material compatibility summary | | | | | | | |
|---|---|---|---|---|---|---|---|
| $F_2$ (%) | 10.5 | 10.5 | 10.5 | 5.3 | 10.5 | 5.3 | 0 |
| FNO (%) | 14.5 | 14.5 | 14.5 | 7.3 | 14.5 | 7.3 | 14.5 |
| $F_3NO$ | Exist | Exist | Exist | Exist | free | free | free |
| Pressure (MPa) | 0.99 | 0.99 | 0.50 | 0.50 | 0.50 | 0.50 | 0.50 |
| Total duration (days) | 7 | 21 | 21 | 43 | 20 | 20 | 20 |
| Non-coated steel | C | C | — | — | — | — | — |
| SS316L | — | C | C | C | C | C | A |
| NiP coated steel | — | A | A* | A* | A* | A* | A* |
| Nickel | — | B | B | B* | B* | B* | B* |
| HASTELLOY ® C-22 ® | — | B | B* | B* | B* | B* | B* |

Note in Table 4, "A" means excellent compatibility or good to use; "A*" means excellent compatibility or good to use but actual tests were not done; "B" means acceptable with limitations or limited; "B*" means acceptable with limitations or limited but actual tests were not done; "C" means poor or not compatible; "—" means no actual tests. The non-coated steel may be any type of steel without a NiP coating on the surface, such as Mn-steel. The SS316L contains up to 14% nickel.

Example 10 Stability (Shelf Life) Test

A 10 L size NiP coated steel cylinder and a Ceodeux D306 Ni body Ni diaphragm cylinder valve were used for stability high-pressure zone include pressure regulator, valves, gas filter, piping, pressure sensors, or the like. The high nickel content alloy may be MONEL®, INCONEL®, HASTELLOY® C-22® or the like. The high-pressure zone may be passivated with $F_2$ or FNO with gradually increasing the pressure. Line components in the low-pressure zone may be made of any metal or any metal alloy including high nickel content material/alloy, low nickel content material/alloy or no nickel content material/alloy, for example, stainless steel. The low-pressure zone may be passivated with $F_2$ or FNO.

With pre-synthesized $F_3NO$-free FNO ($F_3NO$ impurity is less than 1%) on-site, FNO and $N_2$ may be mixed in situ to produce $F_3NO$-free $FNO/N_2$ gas mixture with various concentrations of FNO in $N_2$. Thus, $F_3NO$-free FNO gas may be diluted in $N_2$ and stored in the NiP coated steel cylinder. The concentration of FNO in the mixture of $F_3NO$-free $FNO/N_2$ may range from approximately 0.01% to approximately 80%. Preferably, the concentration of FNO in the mixture of $F_3NO$-free $FNO/F_2/N_2$ may range from approximately 0.01% to approximately 30%. In one embodiment, the concentration of FNO in the mixture of $F_3NO$-free $FNO/N_2$ is approximately 3%. In another embodiment, the concentration of FNO in the mixture of $F_3NO$-free $FNO/N_2$ is approximately 15%.

With pre-synthesized $F_3NO$-free FNO ($F_3NO$ impurity is less than 1%) on-site, FNO and $F_2$ may be mixed in situ to produce $F_3NO$-free $FNO/F_2/N_2$ gas mixture with various concentrations of FNO and $F_2$ in $N_2$. The concentration of FNO in the mixture of $F_3NO$-free $FNO/F_2/N_2$ may range from approximately 0.01% to approximately 80% and the concentration of $F_2$ in the mixture of $F_3NO$-free $FNO/F_2/N_2$ may range from approximately 0% (no $F_2$) to approximately 80%. Preferably, the concentration of FNO in the mixture of $F_3NO$-free $FNO/F_2/N_2$ may range from approximately 0.01% to approximately 30% and the concentration of $F_2$ in the mixture of $F_3NO$-free $FNO/F_2/N_2$ may range from approximately 0% to approximately 20%.

In one embodiment, the concentration of FNO in the mixture of $F_3NO$-free $FNO/F_2/N_2$ is approximately 15% and the concentration of $F_2$ in the mixture of $F_3NO$-free $FNO/F_2/N_2$ is approximately 10%. $F_3NO$-free FNO gas may be diluted in $N_2$ and stored in the NiP coated steel cylinder first. Then either pure $F_2$ or diluted $F_2$ in $N_2$ is mixed with the diluted $F_3NO$-free FNO producing $F_3NO$-free approximately 15% FNO and approximately 10% $F_2$ in $N_2$ gas mixture for use as etching gas in semiconductor applications. The produced $F_3NO$-free approximately 15% FNO and approximately 10% $F_2$ in $N_2$ gas mixture may be stored in the NiP coated steel cylinder. The advantages of supplying pre-synthesized $F_3NO$-free FNO for producing the gas mixture of $F_3NO$-free $FNO/F_2/N_2$ are i) no exothermic reaction by mixing FNO and $F_2$; ii) less to no impurity $F_3NO$ generated; iii) better reproducibility of etching performance shown in the above examples.

Alternatively, the $F_3NO$-free $FNO/F_2/N_2$ gas mixture may be produced in situ by mixing NO (purity at least 99.9%) and $F_2$ gases with two-step $F_2$ mixing method as described above in Example 3. The produced $F_3NO$-free $FNO/F_2/N_2$ gas mixture may be stored in a NiP coated steel cylinder for use as etching gas or other purposes in semiconductor applications. The advantages of producing $F_3NO$-free $FNO/F_2/N_2$ gas mixture by mixing NO and $F_2$ is the concentration of FNO in the $F_3NO$-free $FNO/F_2/N_2$ gas mixture may be adjustable depending on requirements of etching applications.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A method for storage and supply of a $F_3NO$-free FNO-containing gas, the method comprising the steps of:
   storing the $F_3NO$-free FNO-containing gas in a NiP coated steel cylinder with a polished inner surface;
   adding additional $F_2$ to the $F_3NO$-free FNO-containing gas to suppress the formation of $F_3NO$ in the $F_3NO$-free FNO-containing gas;
   passivating a manifold assembly with FNO;
   releasing the $F_3NO$-free FNO-containing gas from the cylinder to the manifold assembly by activating a cylinder valve in fluid communication with the cylinder and the manifold assembly;
   de-pressurizing the $F_3NO$-free FNO-containing gas by activating a pressure regulator in the manifold assembly so as to divide the manifold assembly into a first pressure zone upstream of the pressure regulator and a second pressure zone downstream of the pressure regulator; and
   feeding the de-pressurized $F_3NO$-free FNO-containing gas to a target reactor downstream of the second pressure zone.

2. The method of claim 1, further comprising the step of producing $F_3NO$-free FNO contained in the $F_3NO$-free FNO-containing gas by mixing NO and $F_2$ gases at a ratio of $F_2$ gas to NO gas less than or equal to ½ and a purity of NO gas at least 99.9% by volume, wherein the produced $F_3NO$-free FNO contains less than approximately 1% $F_3NO$ by volume.

3. The method of claim 2, wherein the $F_3NO$-free FNO-containing gas is a gas mixture of $F_3NO$-free FNO gas, $F_2$ and $N_2$ for etch films produced by the steps of
   mixing the produced $F_3NO$-free FNO gas with an additional amount of $F_2$ to produce the gas mixture of the $F_3NO$-free FNO gas and $F_2$; and
   diluting the gas mixture of the $F_3NO$-free FNO gas and $F_2$ in $N_2$ to form the gas mixture of $F_3NO$-free FNO gas, $F_2$ and $N_2$.

4. The method of claim 1, wherein the cylinder valve, the pressure regulator and line components in the first pressure zone are made of nickel containing material having at least 14% nickel by weight.

* * * * *